(12) United States Patent
Holman

(10) Patent No.: US 7,240,145 B2
(45) Date of Patent: *Jul. 3, 2007

(54) MEMORY MODULE HAVING A MEMORY CONTROLLER TO INTERFACE WITH A SYSTEM BUS

(75) Inventor: Thomas J. Holman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/365,295

(22) Filed: Feb. 28, 2006

(65) Prior Publication Data

US 2006/0149857 A1    Jul. 6, 2006

Related U.S. Application Data

(63) Continuation of application No. 09/023,170, filed on Feb. 13, 1998, now Pat. No. 7,007,130.

(60) Provisional application No. 60/067,824, filed on Dec. 5, 1997, provisional application No. 60/067,588, filed on Dec. 5, 1997.

(51) Int. Cl.
*G06F 12/00* (2006.01)
(52) U.S. Cl. .......................................... 711/5; 711/104
(58) Field of Classification Search ...................... None
See application file for complete search history.

(56) References Cited

U.S. PATENT DOCUMENTS

| | | |
|---|---|---|
| 4,045,781 A | 8/1977 | Levy et al. |
| 4,675,516 A | 6/1987 | Guion |
| 4,905,182 A | 2/1990 | Fitch et al. |
| 4,910,393 A | 3/1990 | Gercekci et al. |
| 5,036,493 A | 7/1991 | Nielsen |
| 5,228,132 A | 7/1993 | Neal et al. |
| 5,257,233 A | 10/1993 | Schaefer |
| 5,319,591 A | 6/1994 | Takeda et al. |
| 5,357,621 A | 10/1994 | Cox |
| 5,408,633 A | 4/1995 | Katsumura et al. |
| 5,448,710 A | 9/1995 | Liu |
| 5,497,418 A | 3/1996 | Kudelski |
| 5,655,113 A | 8/1997 | Leung et al. |
| 5,663,901 A | 9/1997 | Wallace et al. |
| 5,790,447 A | 8/1998 | Laudon et al. |

(Continued)

FOREIGN PATENT DOCUMENTS

EP        0 492 817 A2    7/1992

OTHER PUBLICATIONS

Bursky, Dave, ed., "Memory Systems Design and Applications," Hayden Book Company, Inc., Rochelle Park, New Jersey, pp. 213-220, 1980.

*Primary Examiner*—Kevin Verbrugge
(74) *Attorney, Agent, or Firm*—Trop, Pruner & Hu, P.C.

(57) ABSTRACT

A memory module includes a memory module controller to be coupled to a system memory controller by a system memory bus and a plurality of memory devices coupled to the memory module controller, where signaling between the memory module controller and one or more of the memory devices is independent of signal loading or operating voltage of the system memory bus.

17 Claims, 17 Drawing Sheets

U.S. PATENT DOCUMENTS

| | | |
|---|---|---|
| 5,815,646 A | 9/1998 | Purcell et al. |
| 5,825,424 A | 10/1998 | Canfield et al. |
| 5,883,839 A | 3/1999 | Tosaka et al. |
| 5,887,198 A | 3/1999 | Houlberg et al. |
| 6,011,741 A | 1/2000 | Wallace et al. |
| 6,034,878 A | 3/2000 | Osaka et al. |
| 6,141,739 A | 10/2000 | Provence et al. |
| 6,189,073 B1 | 2/2001 | Pawlowski |
| 6,272,583 B1 | 8/2001 | Sakugawa et al. |
| 6,345,321 B1 | 2/2002 | Litaize et al. |
| 6,480,947 B1 | 11/2002 | Hasegawa et al. |
| 6,530,033 B1 | 3/2003 | Raynham et al. |
| 6,742,098 B1 | 5/2004 | Halbert et al. |

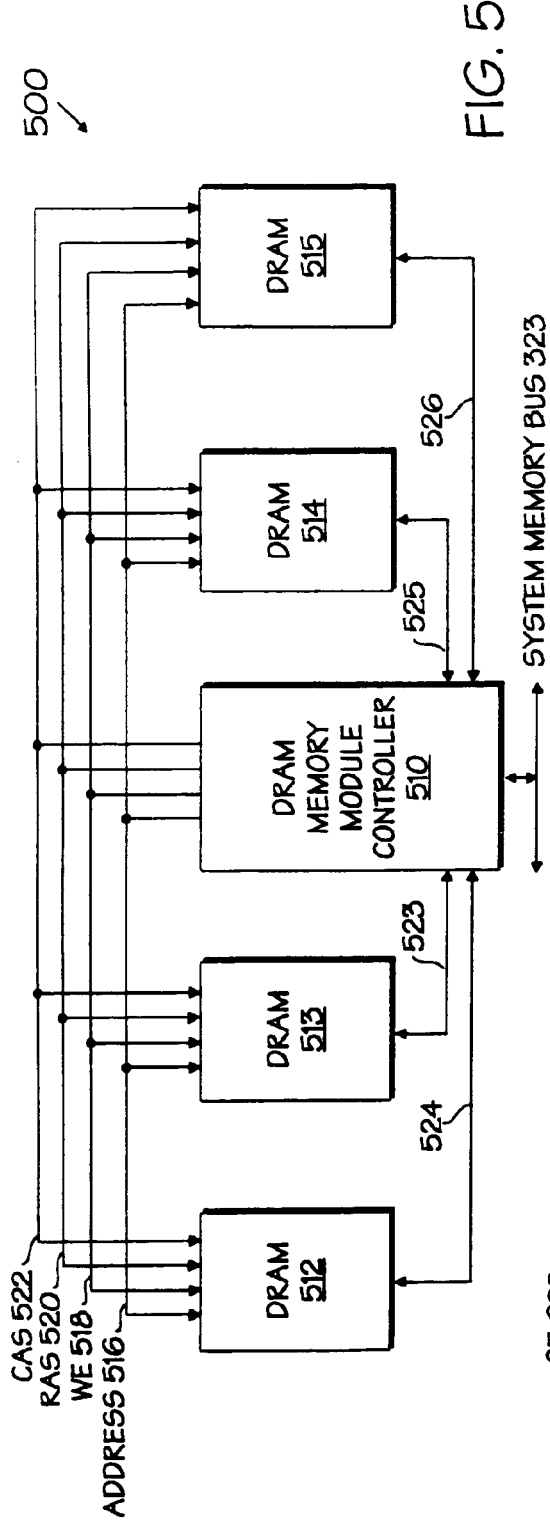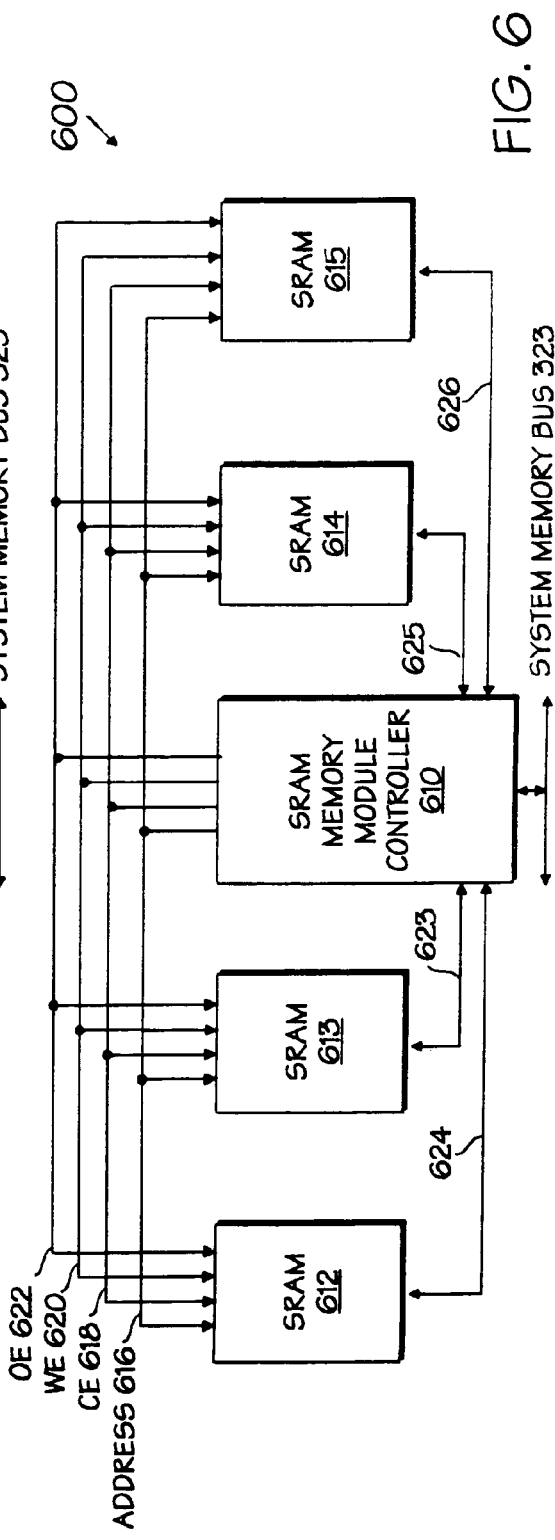

MEMORY MODULE HAVING A MEMORY CONTROLLER TO INTERFACE WITH A SYSTEM BUS

RELATED APPLICATIONS

This application is a continuation of U.S. patent application Ser. No. 09/023,170, now U.S. Pat. No. 7,007,130, entitled MEMORY SYSTEM INCLUDING A MEMORY MODULE HAVING A MEMORY MODULE CONTROLLER INTERFACING BETWEEN A SYSTEM MEMORY CONTROLLER AND MEMORY DEVICES OF THE MEMORY MODULE, filed on Feb. 13, 1998, which is related to and claims the benefit of the filing dates of the following United States Provisional Patent Applications: (1) Provisional Application No. entitled DISTRIBUTED CONTROL MEMORY BUS ARCHITECTURE, filed on Dec. 5, 1997; and (2) Provisional Application No. entitled DISTRIBUTED CONTROL MEMORY BUS ARCHITECTURE, filed on Dec. 5, 1997. These applications are assigned to the same assignee as the present application.

This application is also related to U.S. patent application Ser. No. 09/023,234 now U.S. Pat. No. 6,968,419 entitled MEMORY MODULE HAVING A MEMORY MODULE CONTROLLER CONTROLLING MEMORY TRANSACTIONS FOR A PLURALITY OF MEMORY DEVICES filed on Feb. 13, 1998, and U.S. patent application Ser. No. 09/023,172, now U.S. Pat. No. 6,970,968 entitled MEMORY MODULE CONTROLLER FOR PROVIDING AN INTERFACE BETWEEN A SYSTEM MEMORY CONTROLLER AND A PLURALITY OF MEMORY DEVICES ON A MEMORY MODULE, filed on Feb. 13, 1998, each of which is assigned to the assignee of the present application.

FIELD OF THE INVENTION

The present invention pertains to the field of memory systems. More particularly, the present invention relates to a memory system that includes a memory controller on a memory module.

BACKGROUND

Memory modules such as single in-line memory modules (SIMMs) and dual in-line memory modules (DIMMs) are typically used to store data, instructions, and other information in computers or other digital systems. FIG. 1 shows a typical memory system in which processor 102 communicates with dynamic random access memory (DRAM) devices 110-117 on memory modules 106 and 108, respectively, via memory controller 104. Memory controller 104 communicates appropriate memory instructions (e.g., write, read, refresh, etc.) to memory module 106 via address and command bus 118, and to memory module 108 via address and command bus 120. Data is transferred from memory controller 104 to both modules via bus 122.

There are at least two disadvantages associated with the conventional memory system of FIG. 1: (1) buses 118, 120, and 122 are multi-drop buses that have high capacitive loads which require large drivers in memory controller 104 and in DRAMs 110-117 (to drive bus 122); and (2) there tends to be large mismatches in loading between the address and command buses and data bus 122. These disadvantages combine to reduce the maximum operating frequency, increase power consumption, and decrease performance of the system. Additionally, memory controller 104 may include a high number of pins (e.g., approximately 190 pins for a 4 DIMM SDRAM system) to support access to memory modules 106 and 108. The bus width of data bus 122 is often 64 or 72 bits wide to support larger bandwidths, for example, of up to 100 mega transmissions per second (MT/s).

FIG. 2 shows another typical memory system that uses technology from Rambus, Inc. of Mountain View, Calif. In this system, processor 202 communicates with Rambus dynamic random access memory (RDRAM™) devices 210-217 on memory modules 206 and 208 (also called Rambus in-line memory modules or RIMM™ modules), respectively, via memory controller 204. Memory controller 204 communicates appropriate memory instructions (e.g., write, read, refresh, etc.) and data in a time-multiplexed fashion to memory modules 206 and 208 via memory specific bus 226. Each of the RDRAM™ devices 210-217 include interface logic 218-225, respectively, that enables the RDRAM™ devices to interface to memory specific bus 226. Memory specific bus 226 may operate at a high frequency (e.g., 250 to 400 MHz), have a small bus width (e.g., 16 or 18 signal lines), have symmetric loading for address, command, and data information, and have a bandwidth of up to 800 MT/s. In other embodiments, the address and control information may be separated (demultiplexed) from the data bus in this environment.

The system of FIG. 2 has a number of disadvantages. Each RDRAM™ device includes a significant amount of logic in the interface logic which makes implementation of the RDRAM™ devices more difficult and more expensive than other DRAM devices, and which causes the RDRAM™ devices to draw more power and dissipate more heat than if the logic was not present. This may lead to thermal and reliability problems. Additionally, each RDRAM™ typically includes a delay locked loop (DLL) circuit coupled to a plurality of clock signals on bus 226. The DLL circuits are typically always functioning and drawing significant amounts of power which contributes to thermal and reliability issues. Additionally, memory controller 204 must include relatively large drivers to drive bus 226

In each of the memory systems described in FIGS. 1 and 2, the memory controller must be designed to provide the appropriate memory transactions to the memory devices in a predetermined format and at predetermined times. The memory devices and memory controller must then be designed to work together. It would be advantageous to decouple the design of the memory devices and the memory controller such that independent advances may be made in each technology. It would also be desirable to decouple the operation of the memory devices from the memory controller to decrease power drawn by each memory device and by the entire memory system.

Other features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which:

FIG. 5 is a block diagram of one embodiment of a dynamic random access memory (DRAM) module including a DRAM memory module controller;

FIG. 6 is a block diagram of one embodiment of a static random access memory (SRAM) module including an SRAM memory module controller;

SUMMARY OF THE INVENTION

One embodiment of the present invention includes a system that has a system memory controller and a memory module. The memory module includes a memory module controller coupled to the system memory controller and a plurality of memory devices coupled to the memory module controller.

Other objects, features, and advantages of the present invention will be apparent from the accompanying drawings and from the detailed description that follows.

DETAILED DESCRIPTION

A memory system including distributed control of memory devices on memory modules is described. The present invention includes a memory module controller device on each memory module in the system. The memory module controller communicates with the system memory controller over a system memory bus and with the individual memory devices at the module level. The system memory bus may be a low pin count, high frequency, multiplexed or demultiplexed bus. The memory module controller may communicate with the individual memory devices over wider, lower frequency, demultiplexed signals lines. As the system memory controller communicates directly with only the memory module controllers, the loading on the system memory bus may be reduced and the size of the bus drivers in the system memory controller may also be reduced.

The memory module controller on each memory module is the interface between the system memory controller and the individual memory devices on the modules. This architecture decouples the individual memory devices from the system memory bus and the system memory controller. This may allow for the independent development of the memory device technology. For example, the memory devices may be developed to be faster, wider, to operate at different operating supply voltages, or to operate with reduced voltage swings than if the memory devices where directly communicating with the system memory controller.

The memory module may have its own memory address lines, control lines, and data lines between the memory module controller and the individual memory devices. The signal lines for these point-to-point or bus connections may be significantly shorter than the system interconnection buses used in conventional memory systems. This may allow for reduced loading, better control of capacitance on the address and data lines, and may increase the maximum operating frequency of the module while reducing power drawn by the system. Additionally, power may be further reduced by omitting DLLs from the individual memory devices. A DLL may be included within the memory module controller if required for interfacing with the system memory bus.

Figure 1:
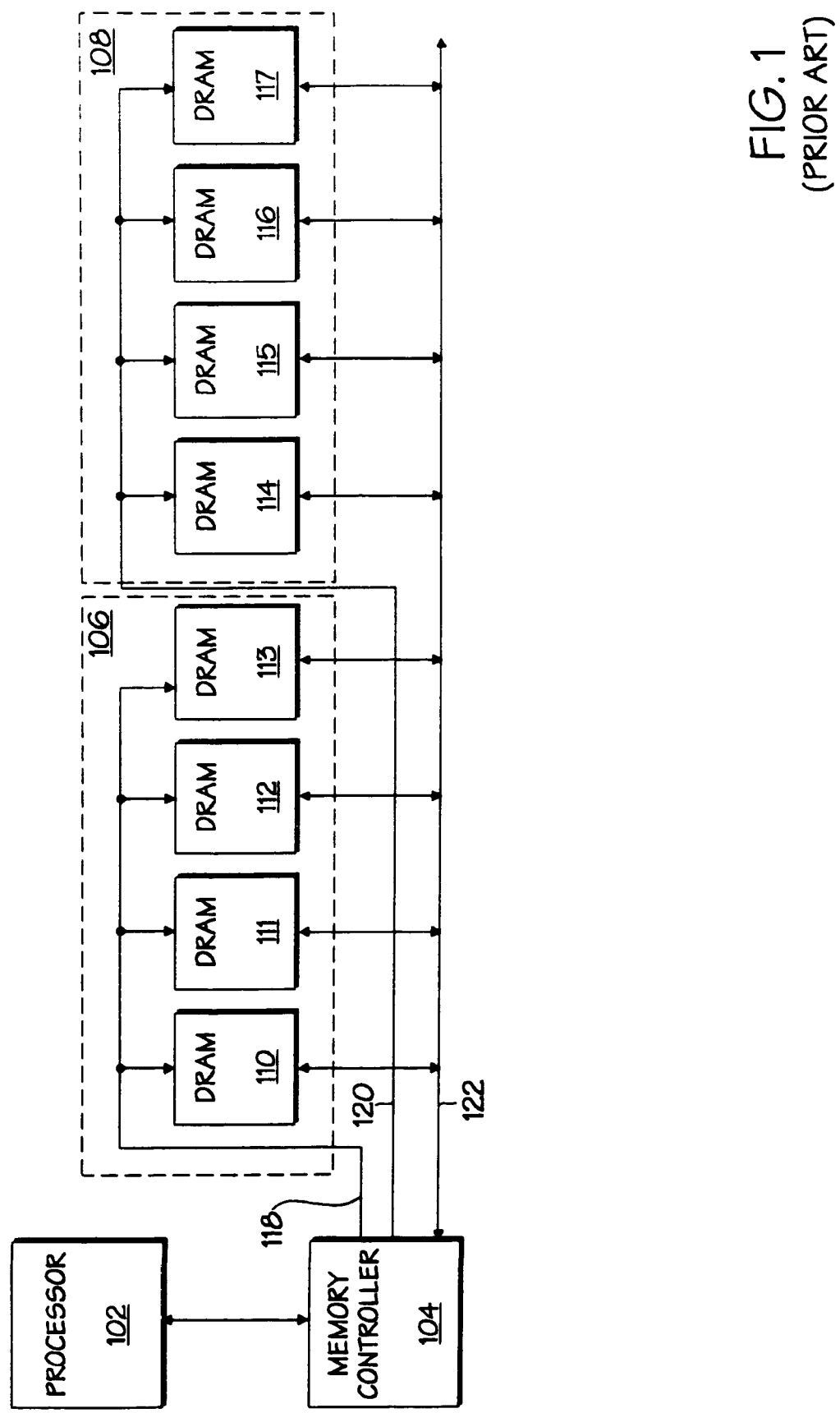
FIG. 1 is a block diagram of one embodiment of a conventional memory system.
Figure 2:
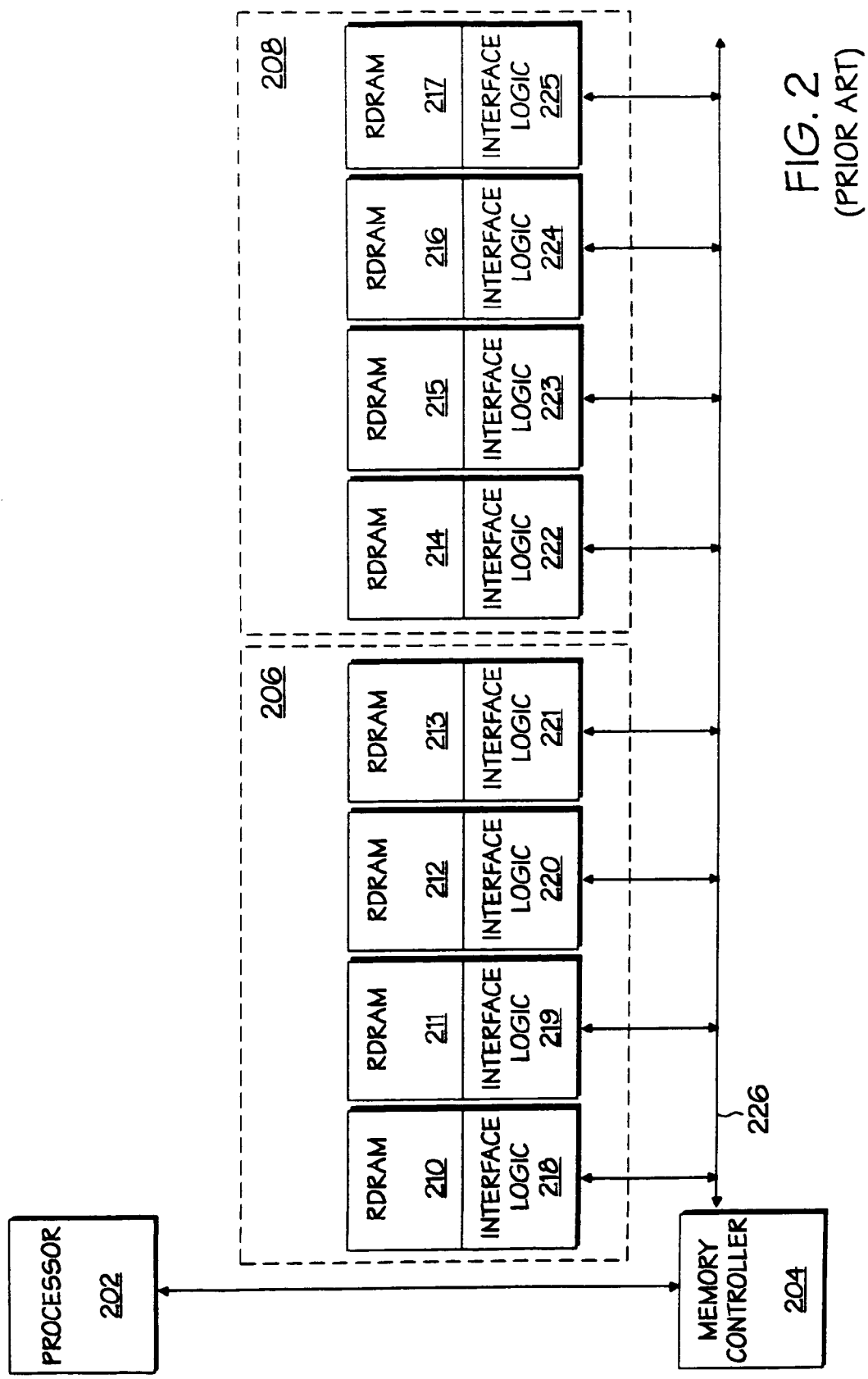
FIG. 2 is a block diagram of another embodiment of a conventional memory system.
Figure 3:
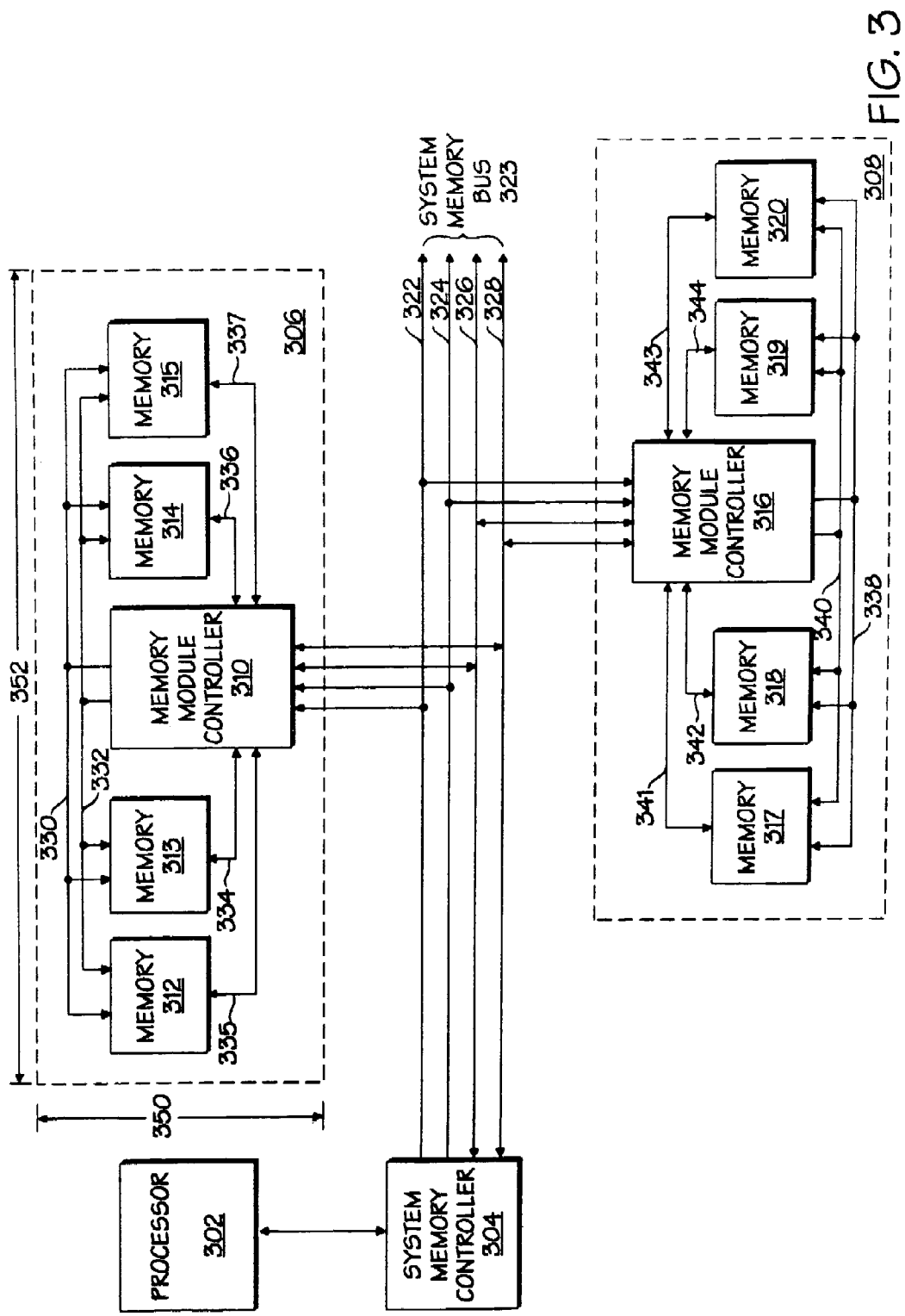
FIG. 3 is a block diagram of one embodiment of a memory system according to the present invention.

FIG. 3 is a block diagram of one embodiment of the present invention. System 300 includes processor 302, system memory controller 304, and memory modules 306 and 308. Processor 302 communicates with system memory controller 304. Processor 302 may be any control logic or microprocessor that communicates write, read, and other memory transactions to system memory controller 304. System memory controller 304 communicates the memory transactions to memory module controllers 310 and 316 of memory modules 306 and 308, respectively, via system memory bus 323. System memory controller 304 may be part of a chip set for a personal computer, for example, or it may be other independent logic.

Memory modules 306 and 308 may be SIMMs, DIMMs, RIMM™ modules, or any other type of memory modules. Each memory module includes a memory module controller and one or more memory devices. For example, memory module 306 includes memory module controller 310 and memory devices 312-315, and memory module 308 includes memory module controller 316 and memory devices 317-320. The memory module controllers may be separate integrated circuits from the memory devices. While system 300 is illustrated as including two memory modules, any number of memory modules may be used. The memory devices may be placed on one side of the module, on both sides of the module, and/or they may be stacked on top of each other. The module may also be a multi-chip module. For one embodiment, a memory module may have an approximate height 350 of from 1 to 2 inches, and an approximate length 352 of from 4 to 6 inches.

Memory modules 310 and 316 communicate memory transactions with system memory controller 304 via system memory bus 323. System memory bus 323 may be a low pin count (e.g., approximately 16 to 35 address, data and control signal lines) bus operating at a high frequency. For one embodiment, system memory bus 323 may operate at a frequency of approximately 200 to 500 MHz. Other frequencies may be used. System memory bus 323 includes a command/address bus 324 and a data bus 328. Command/address bus 324 may time-multiplex commands and address information on one or more of the signal lines. The command and address bus 324 may also be split into separate command and address buses as in SDRAMs. System memory bus 323 may optionally include clock bus 322 that may carry one or more clock signals on the same or separate signal lines, and handshaking bus 326 that may carry a handshaking signal between system memory controller 304 and memory module controllers 310 and 316. The handshaking signal may be generated by system memory controller 304, for example, at the start of a memory request packet or when it is transmitting valid data on data bus 328. The handshaking signal may be generated by memory module controllers 310 and 316 when they are providing valid data requested by system memory controller 304 to data bus 328.

For one embodiment, system memory bus 323 may be compatible with the Direct Rambus™ bus architecture that includes 16 or 18 data bits on bus 328, one or more clock signals on bus 322, and command and address information on bus 324. The clock signals for this embodiment may run at rates of approximately 400 MHz enabling a data transmission rate of up to 800 MT/s. For this embodiment, system memory controller 304 may be any controller that may be able to implement the Direct Rambus™ protocol for memory transactions on system memory bus 323. Additionally, system memory bus 323 may use Rambus Signaling Levels (RSL) for the signals transferred on the bus. For alternative embodiments, any other type of appropriate signaling levels may be used including TTL, CMOS, GTL, SSTL, CTT or other signaling levels.

For another embodiment, system bus 323 may be one general purpose bus that carries time-multiplexed address, data, and control information. For example, system bus 323 may be compatible with Concurrent and Base Rambus™ architectures. For these embodiments, system memory controller 304 may be any controller that may be able to implement these protocols for memory transactions on system memory bus 323.

Figure 4:
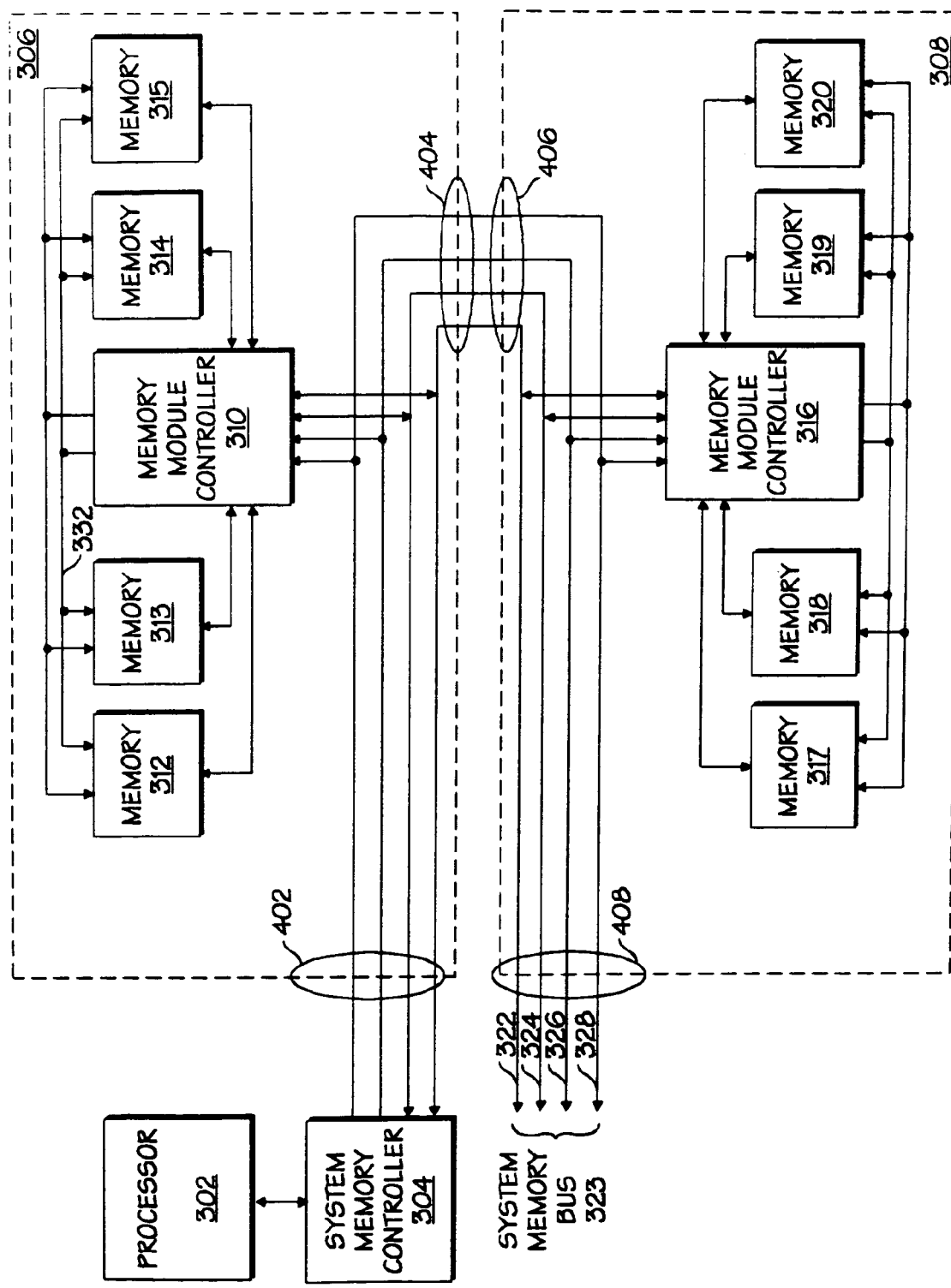
FIG. 4 is a block diagram of another embodiment of a memory system according to the present invention.

System memory bus 323 may by physically placed on a printed circuit board (PCB) that includes system memory controller 304 and interconnection slots for modules 306 and 308 as shown in FIG. 3. Alternatively, system memory bus 323 may be routed through separate channels of memory modules 306 and 308 such as channels 402, 404, 406, and 408 as shown in FIG. 4.

Memory module controllers 310 and 316 operate as bridges between system memory bus 323, that operates in one protocol or format, and local or memory module buses (e.g., lines 330, 332, and 334-337) that operate in a second different protocol or format. Each memory module includes control logic necessary to interpret the memory transaction on system memory bus 323 and translate that transaction into the appropriate control, address, and data signals for its memory devices on the memory module. Similarly, the memory modules interpret the memory transactions on the local or memory module bus into the format required to transmit the transaction to the system memory controller 304 via system memory bus 323.

Memory module controllers 310 and 316 may also include circuitry necessary to perform refresh operations of dynamic memory devices, prefetch operations, error correction functions that may use, for example, ECC bits, current calibration if system memory bus 323 is a current bus, serial presence detect circuitry, a DLL circuit, power management circuitry that may shut off the clock signals or clock enable signals for the memory devices or provide other power down circuits, program and erasing voltages for nonvolatile memory circuits, and/or levelizing circuitry to generate signals on system memory bus 323 in the appropriate clock domains (if there is more than one clock domain on system memory bus 323).

Each memory device on the memory modules communicates memory transactions with its memory module controller via address, data, and control signals. Memory transactions are those transactions that are appropriate for each type of memory device used. For example, the memory transactions may include write, read, refresh, prefetch, power down, reset, erase, and the like. Memory module 306, for example, may communicate memory addresses to memory devices 312-315 via signal lines 330, control information (e.g., chip enable signals, write enable signals, RAS, CAS, output enable signals, etc.) via signal lines 332, and data via point-to-point connections 334-337. Each of the signal lines 330, 332, and 334-337 may be one or more signal lines. Signal lines 330 and 332 may be buses that connect to all four memory devices 312-315, to groups of memory devices (e.g., two at a time), or they may be point-to-point connections to memory module controller 310. Similarly, memory module 308 may communicate memory addresses to memory devices 317-320 via signal lines 338, control information via signal lines 340, and data via point-to-point connections 341-344. Each of the signal lines 338, 340, and 341-344 may be one or more signal lines.

For one embodiment, the number of signal lines 334-337 may be the same as the number of signal line carrying data for system memory bus 323. For another embodiment, the number of signal lines 334-337 may be collectively greater than the number of signal lines carrying data from system memory controller 304 to memory module controller 310 on system memory bus 323. This may increase the bandwidth of the data transfer on the memory module. For example, system memory bus 323 may carry 16 data signals in parallel on bus 328 and memory module controller 310 may simultaneously provide 16 data signals to each of memory devices 312-315. Because the data bus width may be wider (e.g., 64 or 72 bits wide) than that of system memory bus 323 (e.g., 16 bits wide), memory module controller 310 may supply a clock signal on bus 330 to memory devices 312-315 that is a lower frequency than that running on system memory bus 323. For one embodiment, the clock frequency on bus 330 may be approximately 50 to 200 MHz, for example, when the frequency of the clock signal on clock bus 322 is approximately 100 to 400 MHz. The frequency of the clock signal on clock bus 322 may also be double-pumped, that is, perform an action (e.g., load data) on each clock edge.

By having local address, control, and data lines on the memory modules which are decoupled from system bus 323, the length of these signals may be reduced over those on the system memory bus, the loading of these lines may be reduced over that of the system memory, and the loading may be more accurately controlled between the different lines so as to more closely achieve symmetric loading between the signals lines. For example, the loading on the data lines and the address and control lines may have approximately the same loading (e.g., approximately 10 to 40 pF) plus or minus approximately 10 percent. This may advantageously decrease the amount of power drawn by the module and increase the maximum operating frequency of the module for a given memory transaction.

Additionally, by decoupling the memory devices from system memory bus 323 and system memory controller 304, memory device 312-315 and 317-320 may operate from reduced or different power supply voltages than those provided to the balance of system 300. For example, memory devices 312-315 and 317-320 (and/or memory module controllers 310 and 316) may operate from power supplies of approximately 1.8 volts to 2.5 volts while the balance of the components in system 300 may operate at 3.3 volts or 5.0 volts. This may also operate to decrease the amount of power drawn by the module and thus by system 300. Additionally, the voltage swing of the signals on lines 330, 332, and 334-337 may be advantageously chosen to be small (e.g., approximately 1.0 to 2.0 volts) to further reduce power drawn by memory devices 312-315.

Power may be further reduced for each memory device and for the system as a whole when a DLL is required to interface with system memory bus 323. The DLL may be included within memory module controller 310 rather than each of memory devices 312-315 as my have been required in conventional systems.

For another embodiment, address lines 330, control lines 332, and/or data lines 334-337 may be combined into a time-multiplexed bus coupled between memory devices 312-215 and memory module controller 310.

The memory devices 312-315 and 317-320 may be any type of volatile or nonvolatile memory devices such as DRAMs, synchronous DRAMs (SDRAMs), Fast Page Mode DRAMs (FPM DRAMs), extended data out DRAMs (EDO DRAMs), Rambus DRAMs (RDRAM™ devices), synchronous or asynchronous static random access memory (SRAM) devices, read only memory (ROM) devices, programmable ROM (PROM) devices, erasable PROMs (EPROMs), electrically erasable PROMs (EEPROMs), flash memory devices, and the like. Each memory module may include different types of memory devices. For example, memory module 306 may include SDRAMs and memory module 308 may include EDO DRAMs, or memory module 306 may include nonvolatile memory devices and memory module 308 may include volatile memory devices.

FIG. 5 is a block diagram of memory module 500 that is one embodiment of memory module 306 configured as a DRAM memory module. Module 500 includes DRAM memory module controller 510 that provides an interface between DRAM devices 512-515 and system memory bus 323. DRAM memory module controller 510 translates memory transactions received from system memory bus 323 and generates DRAM memory operations (e.g. write, read, prefetch, refresh) including addresses on address bus 516, data signals on data lines 523-526, and control signals such as write enable WE on line 518, RAS on line 520, and CAS on line 522. DRAM memory module controller 510 may also provide additional control signals to DRAMs 512-515 including clock signals for synchronous operation (i.e., for SDRAMs), memory bank select signals, and/or chip select or chip enable signals. DRAM memory module controller may also generate refresh commands, prefetch commands, and/or power management commands to DRAMs 512-515.

FIG. 6 is a block diagram of memory module 600 that is one embodiment of memory module 306 configured as an SRAM memory module. Module 600 includes SRAM memory module controller 610 that provides an interface between SRAM devices 612-615 and system memory bus 323. SRAM memory module controller 610 translates memory transactions received from system memory bus 323 and generates SRAM memory operations (e.g., write, read, reset, power down) including addresses on address bus 616, data signals on data lines 623-626, and control signals such as chip select or chip enable CE on line 618, write enable WE on line 620, and output enable on line 622. SRAM memory module controller 610 may also provide additional control signals to SRAMs 612-615 including clock signals for synchronous operation, burst control signals, interrupt signals, reset signals, write and read signals (e.g., for a first-in-first-out FIFO device), power management signals, byte enable signals, and/or expansion signals.

Figure 7:
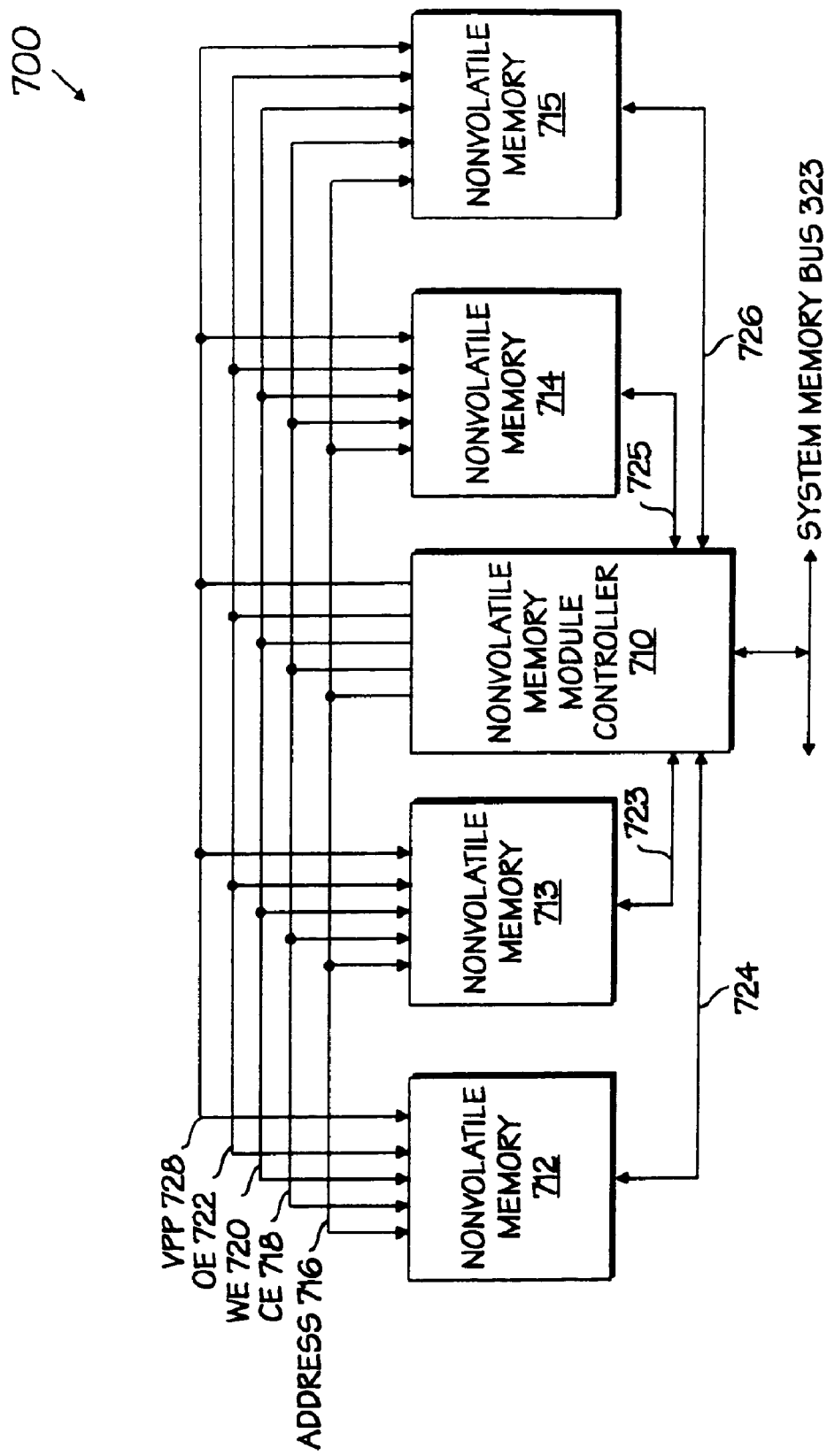
FIG. 7 is a block diagram of one embodiment of nonvolatile memory module including a nonvolatile memory module controller.

FIG. 7 is a block diagram of memory module 700 that is one embodiment of memory module 307 configured as an nonvolatile memory module. Module 700 includes nonvolatile memory module controller 710 that provides an interface between nonvolatile devices 712-715 and system memory bus 323. Nonvolatile memory module controller 710 translates memory transactions received from system memory bus 323 and generates nonvolatile memory operations (e.g., write or program, read, reset, power down, erase, etc.) including addresses on address bus 716, data signals on data lines 723-726, and control signals such as chip select or chip enable CE on line 718, write enable WE on line 720, output enable on line 722, and a programming voltage on line 728. Nonvolatile memory module controller 710 may also provide additional control signals to nonvolatile memory devices 712-715 including clock signals for synchronous operation, burst control signals, reset signals, power management signals, or other signals or commands.

With reference again to FIG. 3, system memory controller 304 and memory module controllers 310 and 316 may communicate using any number of protocols as previously mentioned. In general, these protocols may be multiplexed such that some or all of the address, control, and data information is sent over the same bus lines of system memory bus 323. Alternatively, the protocols may be demultiplexed as shown in FIG. 3 with the data transmitted over a separate data bus from address and control information. Whether the protocol is multiplexed or demultiplexed, the protocol may also be coupled or decoupled. That is, the protocol may be coupled if the system memory controller sends its memory transactions to system memory bus 323 at a first point in time and expects the requested data (in the case of a read transaction) or an acknowledgment signal at a second point in time (i.e., a timed response). The protocol may be decoupled by using a handshaking or valid signal to indicate the start of a memory transaction or to indicate when valid data is transmitted to system memory bus 323 by system memory controller 304 of memory module controllers 310 or 316.

Figure 8:
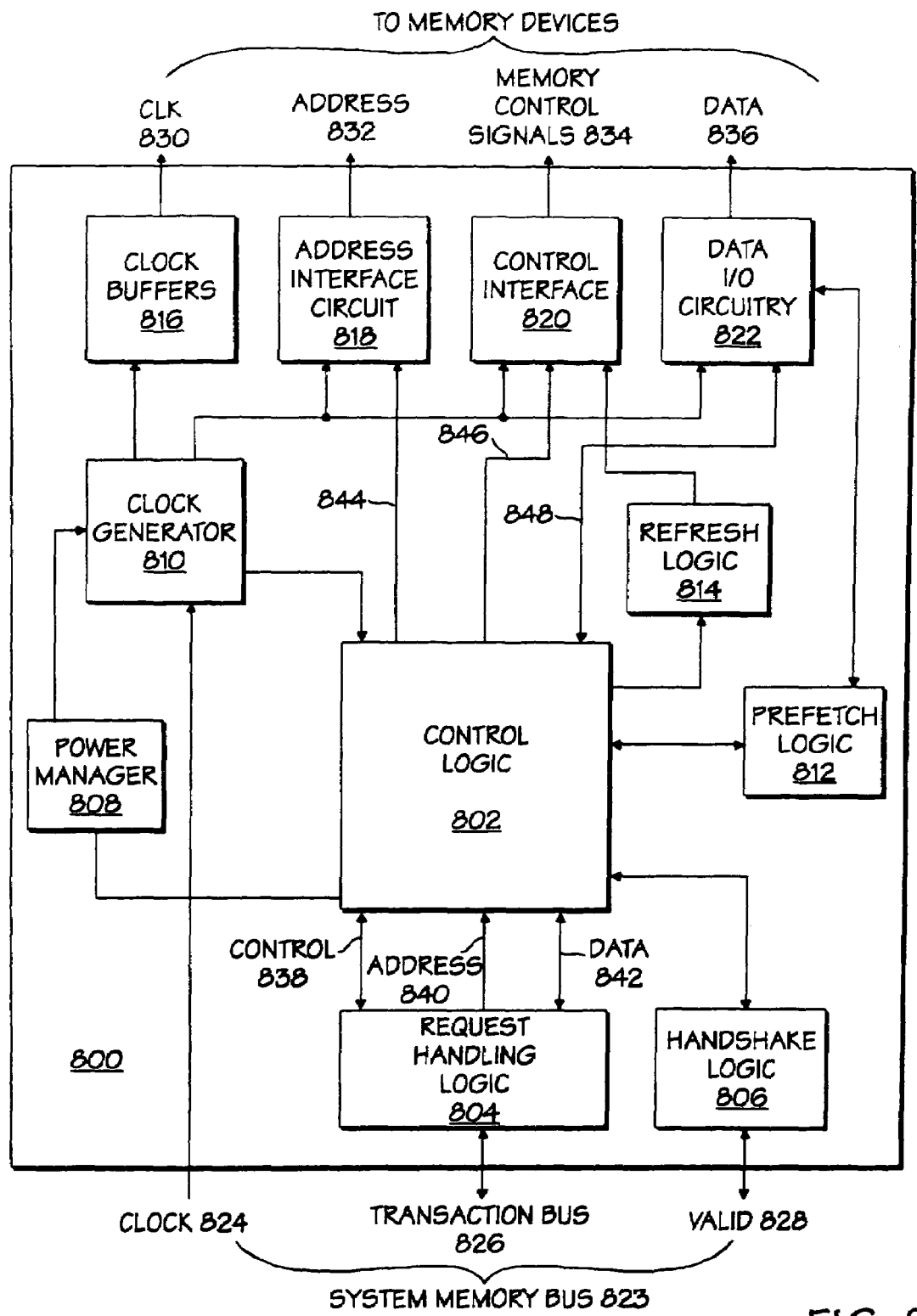
FIG. 8 is a block diagram of one embodiment of the memory module controller of FIG. 3 coupled to a time multiplexed system memory bus.

FIG. 8 is a block diagram of memory module controller 800 that is one embodiment of memory module controller 310 using a time multiplexed protocol. One embodiment of a time multiplexed protocol may be the Base and Concurrent Rambus™ protocols. Other protocols may be also be used. It will also be appreciated that memory module controller 800 is only one embodiment of a memory module controller. Other embodiments may also be used without departing from the spirit and scope of the present invention.

Memory module controller 800 interfaces between system memory bus 823 that includes one or more clock signal lines 824, a transaction bus 826, and may optionally include a valid signal 828. The transaction bus 826 is a general purpose bus that may carry address, data, and control information for a memory transaction. Valid signal 828 is one or more handshaking signals that may be used for a decoupled protocol to indicate the start of a memory transaction or to indicate when valid data is present on transaction bus 826. Valid signal 828 may be monitored and generated by handshake logic 806 under the control of control logic 802. Valid signal 828 may be omitted for a coupled protocol. Memory module controller 800 also interfaces with memory devices on a memory module (as in FIG. 3) by providing a clock signal 830, address signals 832, control signals 823, and data signals 836. Clock signal 830 may be omitted for asynchronous memory devices.

Memory module controller 800 includes request handling logic 804 for interfacing with transaction bus 826. Request handling logic 804 may include deserializing logic that may separate the multiplexed control, address, and data information provided on transaction bus 826 and provide these signals to control logic 802 via lines 838, 840, and 842, respectively. Request handling logic 804 may also include serializing logic that may serialize control, address, and data information on lines 838, 840, and 842, respectively, into a time-multiplexed series of signals to be provided to transaction bus 826.

Control logic 802 is the intelligence of memory module controller 800, and generates the appropriate control, address, and data signals for the memory module memory devices in response to the signals received from request handling logic 804. Each memory module controller device in each module may have different control logic that may be implement a specific translation between the signal types and protocol on the system memory bus and the specific memory signals and protocol expected by the memory devices on the memory module. For example, control logic 802 may provide the appropriate address signals to address interface circuit 818 via lines 844, the appropriate control signals to control interface circuit 820 via lines 846, and the appropriate data signals to data I/O circuitry 822 via lines 848. The interface circuits may include buffers and register elements to drive address 832, memory control signals 834, and data 836.

Interface circuits 818, 820, and 822 may be clocked by a clock signal generated by clock generator 810. Clock generator 810 may also provide a clock signal to control logic 802 and to clock buffers 816 which may drive clock signal 830 and/or clock enable signals to memory devices on a memory module. Clock generator 810 may generate clock signals in response to clock 824 provided from system memory bus 823. CLK 830 may be a different frequency than clock 824. Memory module controller 800 or clock generator 810 may further include a DLL, clock buffer, or clock divider circuit that shapes or alters clock 824 before it reaches clock generator 810.

Memory module controller 800 may also include a power manager unit 808 that, under the control of control logic 802, may enable or disable clock generator 810. This may, in turn, enable or disable clock 830 or a clock enable signal provided to the memory devices on a memory module so as to control power dissipated by the memory devices.

Memory module controller 800 may further include refresh logic 814 and prefetch logic 812. Under the control of control logic 802, refresh logic 814 may send refresh control signals to memory devices on a memory module via control interface circuit 820. Control logic 802 may generate the refresh command at an appropriate time, or it may generate a refresh command in response to a refresh command sent over transaction bus 826 from system memory controller 304. Prefetch logic 812 may, under the control of control logic 802, prefetch a page of data from memory devices (e.g., DRAM devices) and store the prefetched data for use in memory read transactions.

Memory module controller 800 may further include serial presence detect circuitry, ECC circuitry, current calibration circuitry, and other circuitry that may be removed from either the system memory controller or from the memory devices to reduce the complexity of the designs of these parts. This may reduce the number of pins on the system memory controller.

Figure 9:
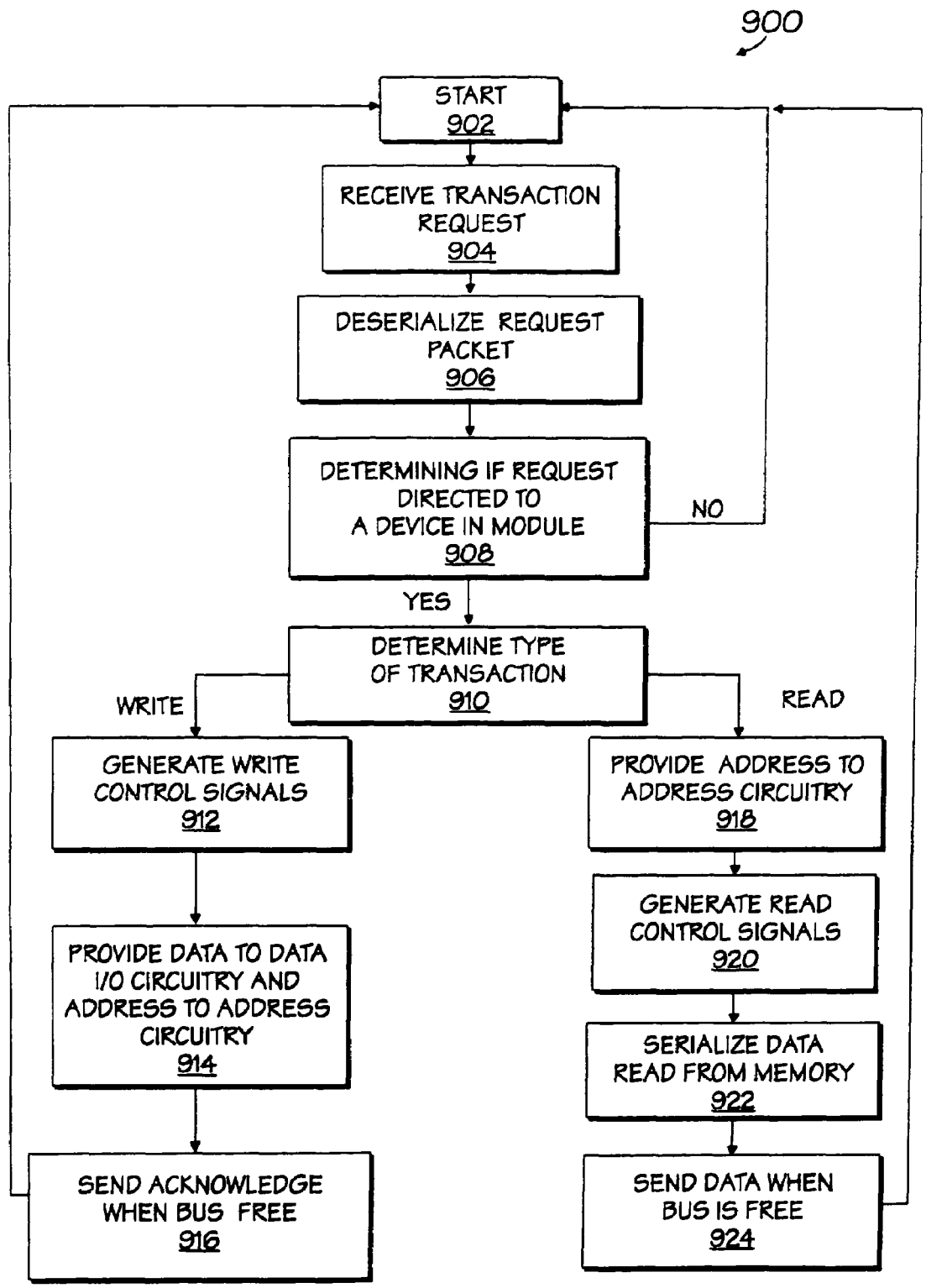
FIG. 9 is a flow chart of one embodiment of the process implemented by the memory module controller of FIG. 8.

FIG. 9 shows a flow chart that illustrates one embodiment of the operation of memory module controller 800 for write and read transactions. The process may be a pipelined process or implemented a single stage process. It will be appreciated that memory module controller 800 may perform many more functions besides translating write and read transactions between a system memory controller and memory devices on a memory module.

The process starts at step 902. At step 904, memory module controller 800 receives a memory transaction request on transaction bus 826. Data handling logic 804 deserializes the transaction at step 906 to obtain the address, control, and data information of the transaction. At step 908, control logic 802 inspects the deserialized information and determines if the transaction is directed to a memory device of the module controlled by memory module controller 800. This may be accomplished by inspecting the memory address received to see if it corresponds to an address occupied by one of the memory devices in the memory module. If the transaction is not directed to a memory device controlled by memory module controller 800, the process returns to step 902. If the transaction is directed to a memory device controlled by memory module controller 800, control logic 802 determines what type of transaction is requested at step 910. If the transaction is a write transaction, control logic 802 generates the appropriate write control signals (e.g., WE, CS, etc.) at step 912 and provides these signals to control interface circuit 820. At step 914, control logic 802 then provides the write data in the appropriate data format to data I/O circuitry 822 and the address of the selected memory device to address interface circuit 818. The write data may be buffered in a write buffer (not shown). The data may then be written into the desired memory location of the selected memory device. At step 916, an optional acknowledge signal may be sent back to the system memory controller after the write operation is completed. The process then returns to step 902.

If the transaction is a read transaction, control logic 802 then provides the read address of the selected memory device to address interface circuit. At step 920 control logic 802 generates the appropriate read control signals (e.g., WE, CS, OE, etc.) and provides these signals to control interface circuit 820. The data may then be read from the desired memory location of the selected memory device. The read data may be buffered in a read buffer (not shown), stored in control logic 802, or registered. At step 922, the read data may be provided to request handling logic 804 where it is serialized and may be framed by other data including, for example, a request number indicating this particular read transaction. At step 924, the read data may then be sent back to the system memory controller when system memory bus 823 is free or when all other previous transactions have been completed. For one embodiment, handshake logic 806 or other logic (e.g., request handling logic 804, control logic 802, or other bus monitoring logic) may monitor the activity on system memory bus 823 and indicate to control logic 802 when it is the turn of memory module controller 800 to send its read data to the system memory controller on bus system memory bus 823. The read data may be sent back with valid signal 828 in a decoupled system. The process then returns to step 902.

Figure 10:
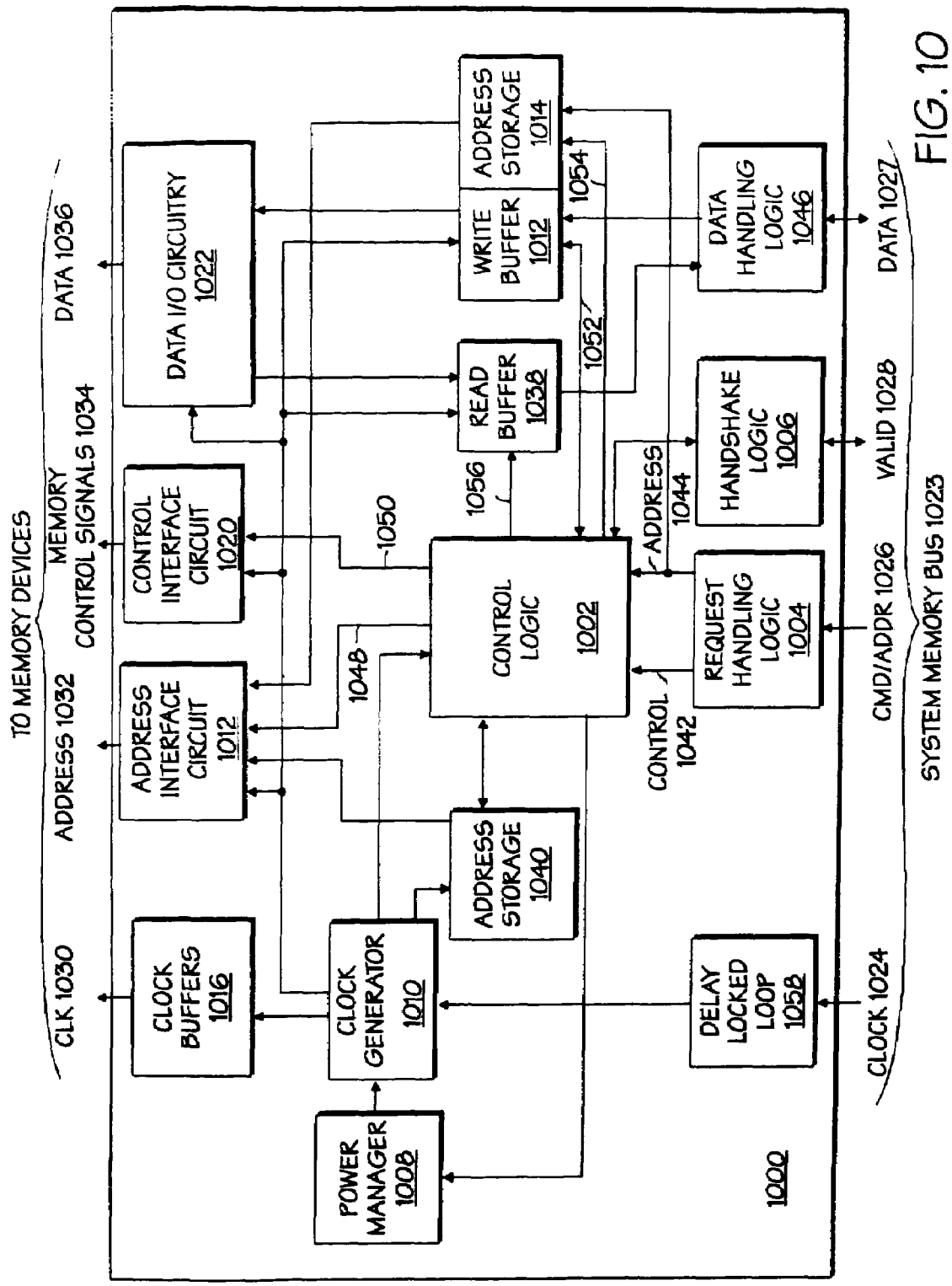
FIG. 10 is a block diagram of one embodiment of the memory module controller of FIG. 3 coupled to a demultiplexed system memory bus.

FIG. 10 is a block diagram of memory module controller 1000 that is one embodiment of memory module controller 310 using a demultiplexed protocol. One embodiment of a demultiplexed protocol may be Direct Rambus™ protocol. Other protocols may also be used. It will also be appreciated that memory module controller 1000 is only one embodiment of a memory module controller. Other embodiments may also be used without departing from the spirit and scope of the present invention.

Memory module controller 1000 interfaces between system memory bus 1023 that includes one or more clock signal lines 1024, a command and address bus CMD/ADDR 1026, data bus 1027, and may optionally include a valid signal 1028. CMD/ADDR bus 1026 may carry both address and control information for a memory transaction. Alternatively, CMD/ADDR bus 1026 may be separated into separate command and address buses. Valid signal 1028 is a handshaking signal that may be used for a decoupled protocol to indicate the start of a memory transaction or to indicate when valid data is present on transaction bus 1026. Valid signal may be monitored and generated by handshake logic 1006 under the control of control logic 1002. Valid signal 1028 may be omitted for a coupled protocol. Memory module controller 1000 also interfaces with memory devices on a memory module (as in FIG. 3) by providing a clock signal 1030, address signals 1032, control signals 1023, and data signals 1036. Clock signal 1030 may be omitted for asynchronous memory devices.

Memory module controller 1000 includes request handling logic 1004 for interfacing with transaction bus 1026. Request handling logic 1004 may include deserializing logic that may separate the multiplexed control and address information provided on CMD/ADDR bus 1026 and provide these signals to control logic 1002 via lines 1042 and 1044, respectively. Request handling logic 1004 may also include serializing logic that may serialize control and address information on lines 1042 and 144, respectively, into a series of signals to be provided to CMD/ADDR bus 1026.

Memory module controller 1000 further includes data handling logic 1046 that may receive data from data bus 1027, reformat the data into a format appropriate for the memory devices of the memory module and provide the reformatted data to write buffer 1012. For one embodiment, data handling logic 1046 may include deserializing or unpacking logic to perform the translation between, for example, a narrow (e.g., 16 bit) data bus 1027 and a wider (e.g., 64 bit) memory device data bus 1036. The data may be stored in write buffer 1012 until it needs to be provided to a memory device via data I/O circuitry 1022. A corresponding address for the write data may be stored in address storage unit 1014. For an alternative embodiment, write buffer 1012 may be omitted. Data handling logic 1046 may also receive data from the memory devices of a memory module via data I/O circuitry 1022 and/or read buffer 1038. Data handling logic may then reformat the data into a format expected by the protocol of system memory bus 1023. For one embodiment, data handling logic 1046 may include serializing or packing logic to perform the translation between, for example, a wider (e.g., 64 bit) memory device data bus 1036 and a narrower (e.g., 16 bit) data bus 1027. For yet another embodiment, data handling logic may be omitted and the formatting of data may be performed by control logic 1002.

Control logic 1002 is the intelligence of memory module controller 1000, and provides the appropriate control, address, and data signals for the memory module memory devices in response to the signals received from request handling logic 1004. Each memory module controller device in each mode may have different control logic that may be implement a specific translation between the signal types and protocol on the system memory bus and the specific memory signals and protocol expected by the memory devices on the memory module. For example, control logic 1002 may provide the appropriate address signals to address interface circuit 1018 via lines 1048, the appropriate control signals to control interface circuit 1020 via lines 1050, and the appropriate data signals to data I/O circuitry 1022 by controlling write buffer 1012 via line 1052 and address storage 1014 via lines 1054. Control logic 1002 may also provide the appropriate control signal to read buffer 1038 to control when data read from a memory device on a memory module is provided to data handling logic 1046. The interface circuits may include buffers and register elements to drive address 1032, memory control signals 1034 and data 1036.

Interface circuits 1018, 1020, and 1022 may be clocked by a clock signal generated by clock generator 1010. Clock generator 1010 may also provide a clock signal to control logic 1002 and to clock buffers 1016 which may drive clock signal 1030 and/or clock enable signals to memory devices on a memory module. Clock generator 1010 may generate clock signals in response to a clock signal provided by DLL 1058. DLL 1058 may receive on or more clock signals 1024 provided from system memory bus 1023. CLK 1030 may be a different frequency than clock 1024.

Memory module controller 1000 may also include a power manager unit 1008 that, under the control of control logic 1002 may enable or disable the clock generator. This may, in turn, enable or disable clock 1030 or a clock enable signal provided to the memory devices on a memory module so as to control power dissipated by these memory devices.

Memory module controller 1000 may optionally include address storage unit 1040 coupled to control logic 1002, address interface circuit 1018, and optionally to clock generator 1010. Address storage 1040 may be used to store address information that may be provided from CMD/ADDR 1026.

Memory module controller 1000 may further include refresh and prefetch logic as illustrated in FIG. 8 which operates under the control of control logic 1002. Memory module controller 1000 may further include serial presence detect circuitry, ECC circuitry, current calibration circuitry, and other circuitry that may be removed from either the system memory controller or from the memory devices to reduce the complexity of the designs of these parts. This may reduce the number of pins on the system memory controller.

Figure 11:
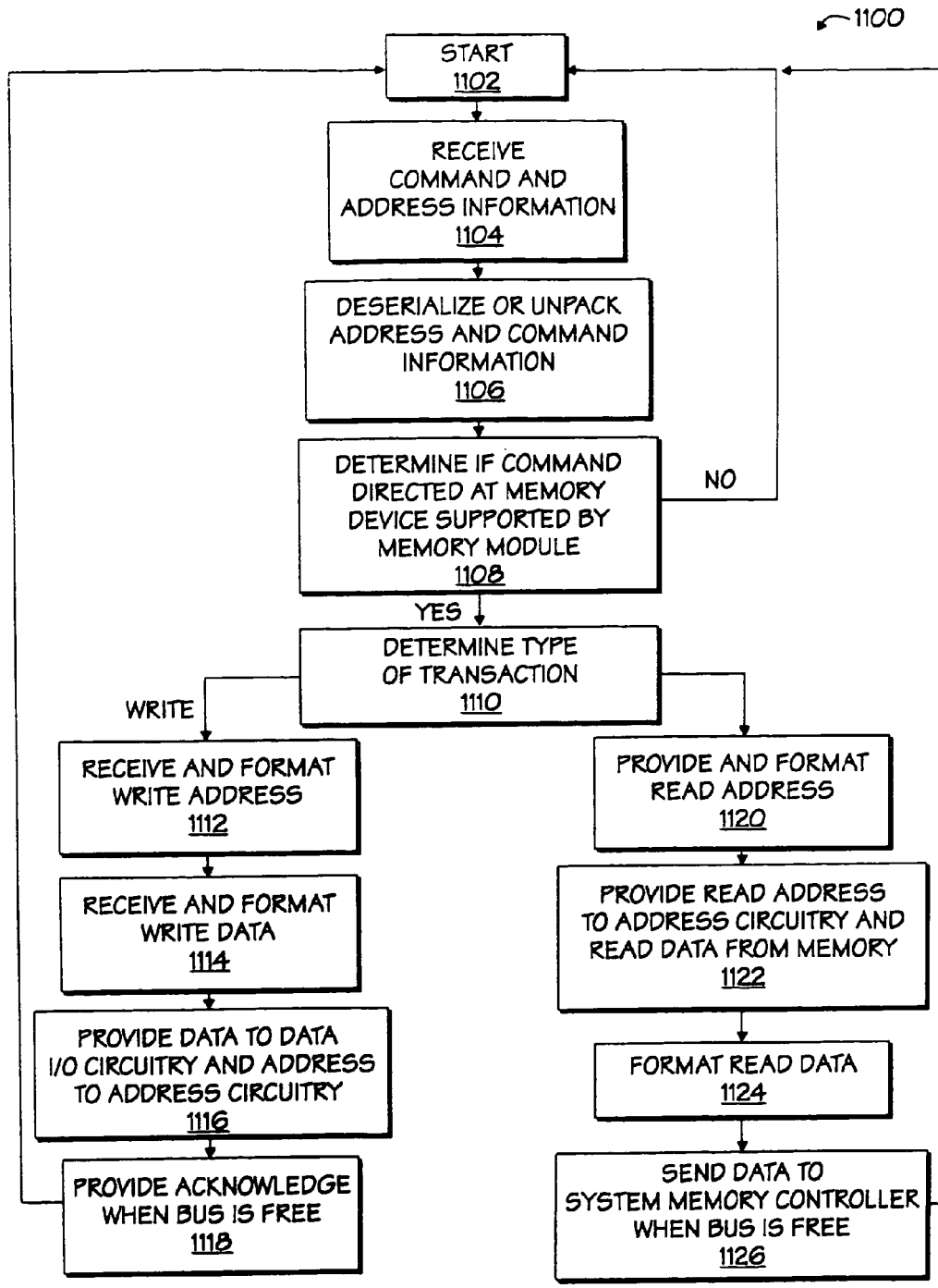
FIG. 11 is a flow chart of one embodiment of the process implemented by the memory module controller of FIG. 10.

FIG. 11 shows a flow chart that illustrates one embodiment of the operation of memory module controller 1000 for write and read transactions. The process may be a pipelined process or implemented a single stage process. It will be appreciated that memory module controller 1000 may perform many more functions besides translating write and read transaction between a system memory controller and memory devices on a memory module.

The process starts at step 1102. At step 1104, memory module controller 1000 receives a memory transaction request on CMD/ADDR bus 1026. At step 1006, data handling logic 1004 unpacks or deserializes the command and address information and transmits this information to control logic 1002. At step 1106, control logic 1002 inspects the unpacked or deserialized information and determines if the transaction is directed to a memory device in the module controlled by memory module controller 1000. This may be accomplished by inspecting the memory address received to see if it corresponds to an address occupied by one of the memory devices in the memory module. If the transaction is not directed to a memory device controlled by memory module controller 1000, the process returns to step 1102. If the transaction is directed to a memory device controlled by memory module controller 1000, control logic 1002 determines what type of transaction is requested at step 1110. If the transaction is a write transaction, control logic 1002 generates the appropriate write control signals (e.g., WE, CS, etc.) at step 1112 and provides these signals to control interface circuit 1020. Request handling logic 1004 may also provide the write address to address storage 1014. Alternatively, control logic 1002 may provide the write address to address interface circuit 1018, for example, when write buffer 1012 is not used. At step 1114, data handling logic 1046 accepts write data from 1027, unpacks or deserializes the write data, and provide the write data to write buffer 1012. At step 1116, the write data is provided in the appropriate data format to data I/O circuitry 1022. The data may then be written into the desired memory location of the selected memory device. At step 1118, an optional acknowledge signal may be sent back to the system memory controller after the write operation is completed. The process then returns to step 1102.

If the transaction is a read transaction, control logic 1002 generates the appropriate read control signals (e.g., WE, CS, OE, etc.) at step 1120 and provides these signals to control interface circuit 1020. At step 1122, control logic 1002 then provides the read address of the selected memory device to address interface circuit 1018. The data may then be read from the desired memory location of the selected memory device. The read data may be buffered in read buffer 1038, stored in control logic 1002, or registered. At step 1124, the read data may be provided to data handling logic 1046 where it is serialized or packed and may be framed by other data including, for example, a request number indicating this particular read transaction. At step 1126, the read data may then be sent back to the system memory when the system memory bus is free or when all other previous transactions have been completed. For one embodiment, handshake logic 1006 or other logic (e.g., request handling logic 1004, data handling logic 1046, control logic 1002, or other bus monitoring logic) may monitor the activity on system memory bus 1023 and indicate to control logic 1002 when it is the turn of memory module controller 1000 to send its read data to the system memory controller on bus system memory bus 1023. Valid read data may be sent back with valid signal 1028 in a decoupled system. The process then returns to step 1102.

Figure 12:
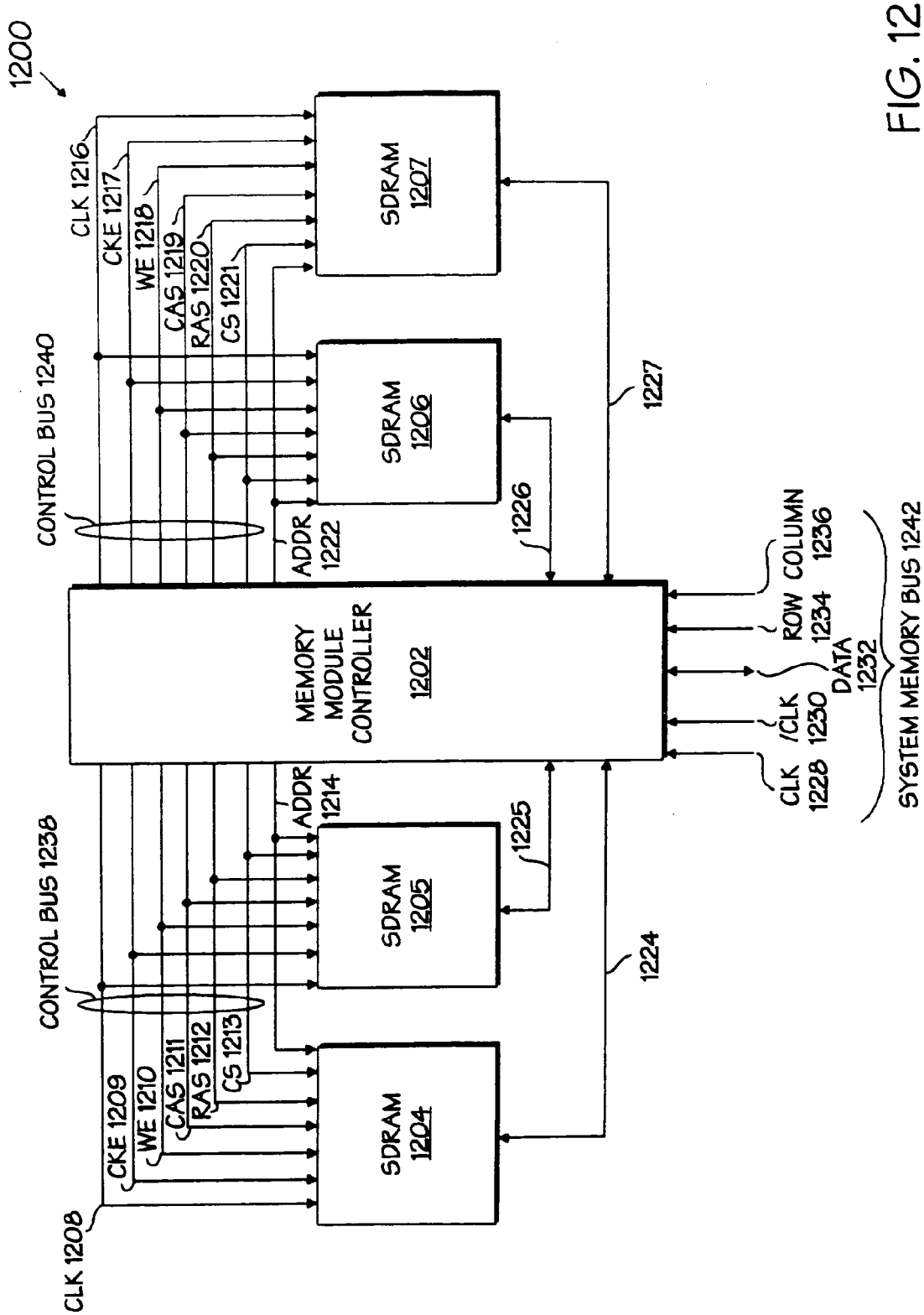
FIG. 12 is a block diagram of one embodiment of a memory module including a memory module controller interfacing SDRAM devices with a system memory bus using a Direct Rambus™ protocol.

FIG. 12 is a block diagram of memory module 1200 that is one embodiment of memory module 306 of FIG. 3. Memory module 1200 is an SDRAM module that includes SDRAM devices 1204-1207 and memory module controller 1202. Memory module controller 1202 provides a bridge between system memory bus 1242 using a Direct Rambus™ protocol (and coupled to a system memory controller) and SDRAM devices 1204-1207. The Direct Rambus™ protocol includes clock signals CLK 1228, /CLK 1230 (where the symbol "/" indicates a complementary signal), data lines 1232, row address lines 1234, and column address lines 1236. The data may include 16 signals lines, the row address may include 3 signal lines, and the column address may include 5 signal lines as described in the Advance Information Direct RDRAM™ 64/72-Mbit (256K×16/18×16d) data sheet. For one embodiment, CLK 1228 and /CLK 1230 may have a frequency of approximately 400 MHz. Other signals used by this protocol are not shown so as not to obscure the present invention.

Memory module controller 1202 provides memory transactions received from system memory bus 1242 to SDRAMs 1204-1207. For one embodiment, SDRAMs 1204-1207 may be 64 Mb SDRAMs such as described in the preliminary data sheet of IBM's IBM0364804C, IBM 0364164C, IBM0364404C, and IBM03644B4C products published in November 1997. Other SDRAMs may also be used.

Memory module controller 1202 provides first control information to SDRAMs 1204 and 1205 over control bus 1238, and second control information to SDRAMs 1206 and 1207 over control bus 1240. Control bus 1238 may include a clock signal CLK 1208, a clock enable signal CKE 1209, a write enable signal WE 1210, a column address strobe signal CAS 1211, a row address strobe RAS 1212, and one or chip select signals CS 1213. Similarly, control bus 1240 may include a clock signal CLK 1216, a clock enable signal CKE 1217, a write enable signal WE 1218, a column address strobe signal CAS 1219, a row address strobe RAS 1220, and one or chip select signals CS 1221. For one embodiment, the frequency of the CLK 1208 and CLK 1216 may be approximately 100 MHz to 200 MHz. Other frequencies may be used. Memory module controller also communicates memory address signals SDRAMs 1204 and 1205 via address bus 1214, and to SDRAMs 1206 and 1207 via address bus 1222. For one embodiment, each address bus may include 12 address lines and an additional two bank select lines for selecting banks of memory in each SDRAM device. In an alternative embodiment, control bus 1238 and 1240 may be the same bus as shown in FIG. 3. Similarly, address buses 1214 and 1222 may be the same bus. Memory module controller also communicates read and write data with SDRAMs 1204, 1205, 1206, and 1207 via signal lines 1224, 1225, 1226, and 1227, respectively. For one embodiment, each group of signal lines may include 16 data lines.

Figure 13:
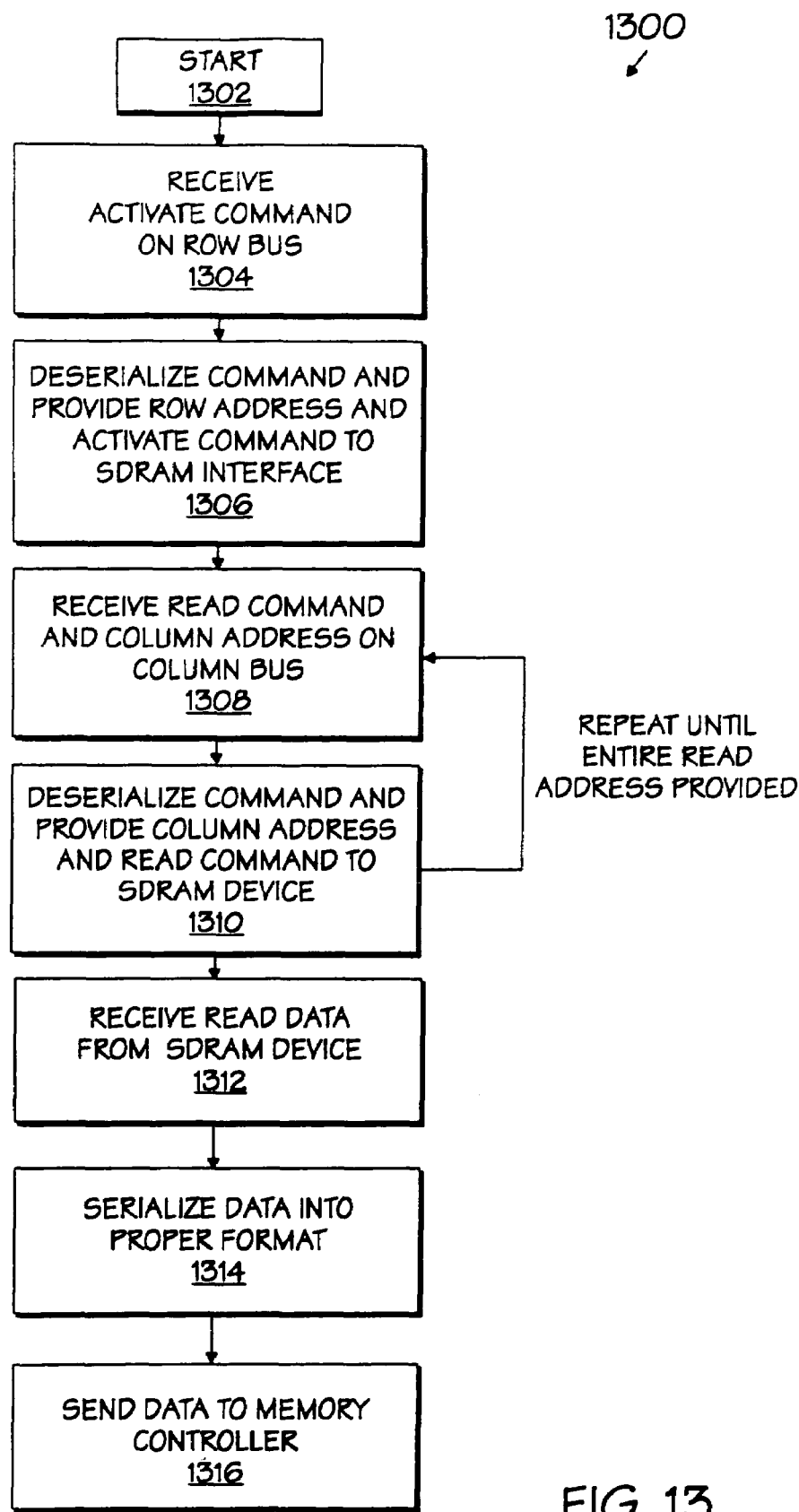
FIG. 13 is a flow chart of one embodiment of a read transaction implemented by the memory module controller of FIG. 12.
Figure 14:
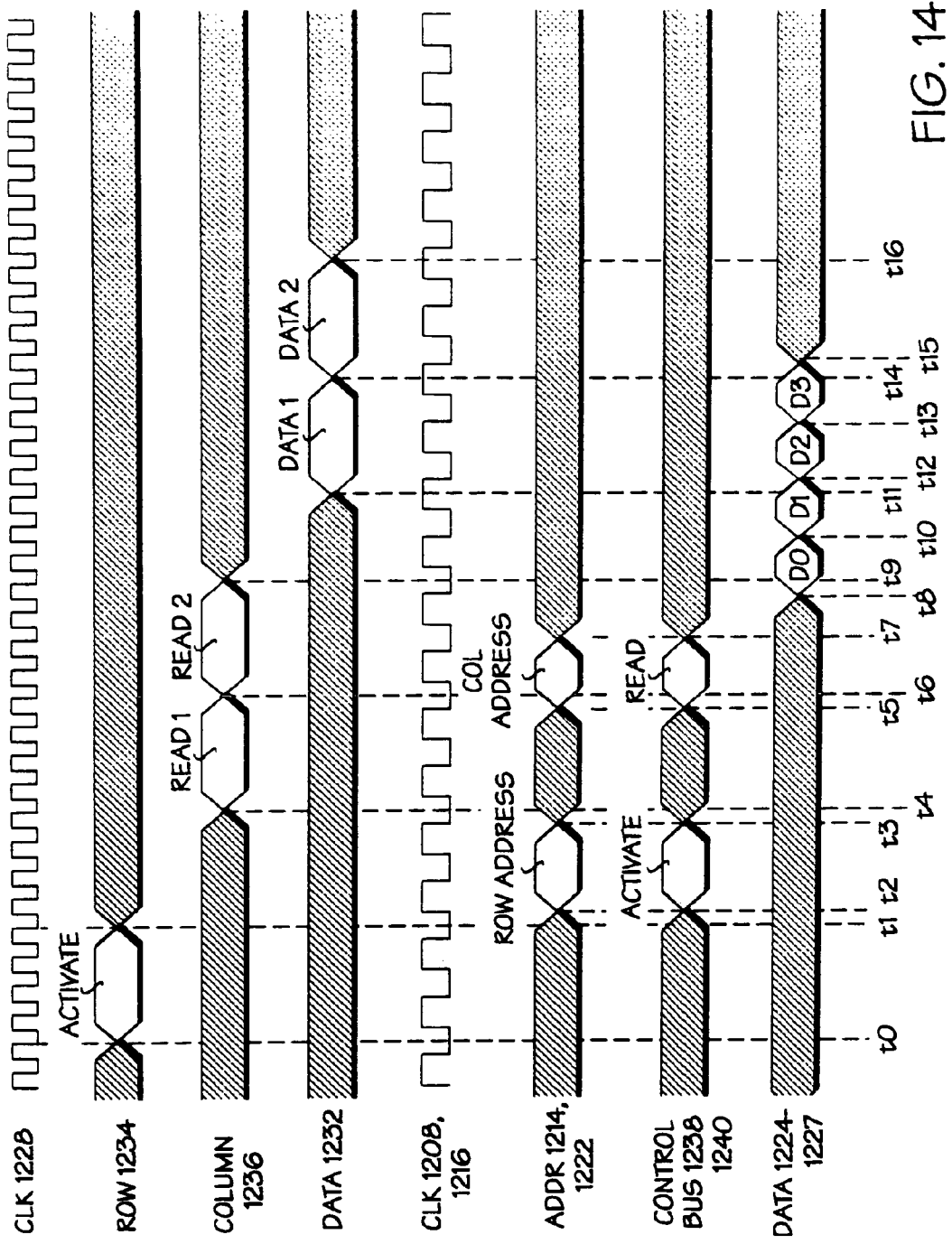
FIG. 14 is an exemplary timing diagram of the read transaction implemented by the memory module controller of FIG. 12.

FIG. 13 shows one embodiment of a process implemented by memory module controller 1202 to perform a read transaction from one or more of SDRAMs 1204-1207 after receiving a read request from system memory bus 1242. FIG. 13 is described with the aid of the exemplary timing diagram of FIG. 14. It will be appreciated that FIG. 14 shows CLK 1228 having approximately twice the frequency of CLK 1208. For one embodiment, CLK 1228 may have a frequency of approximately 400 MHz and CLK 1208 may have a frequency of approximately 200 MHz. For other embodiments, different ratios of frequencies, and/or different frequencies, may be used.

Memory module controller 1202 may implement the process of FIG. 13 using the circuitry shown in memory module 1000 of FIG. 10. For example, CLK 1024 corresponds to CLK 1228, CMD/ADDR 1026 corresponds to row 1234 and column 1236, data 1027 corresponds to data 1232, CLK 1030 corresponds to CLK 1208, address 1032 corresponds to address 1214, memory control signals 1034 corresponds to control bus 1238, and data 1036 corresponds to data 1224. For other embodiments, other circuitry may be used to implement the process of FIG. 13.

The process starts at step 1302. At step 1304 and from time t0 to time t1, an activate command is sent on row lines 1234 including a device, bank, and row address of selected memory locations in one or more of SDRAMs 1204-1207.

At step 1306 and from time t2 to time t3, data request logic 1004 deserializes the command and address information and provides this information to control logic 1002. Control logic 1002 then provides the row address to the selected SDRAMs over address bus 1214 and/or 1222, and the appropriate bank activate command to the selected SDRAMs over control bus 1238 and/or 1240. For one embodiment, the appropriate bank activate command includes disabling CAS lines 1211 and/or 1219 and WE lines 1210 and/or 1218, and enabling CS lines 1213 and/or 1221 and RAS lines 1212 and/or 1220 at the rising edge of CLK 1208 and/or 1216.

Because the memory addressing scheme protocol used by Direct RDRAM™ devices may be different than that used by the selected SDRAMs, the activate command supplied on row address lines 1234 may include column address information for the selected SDRAMs. In this example, this column address information may be stored in address storage unit 1040 until such time that the column address information is issued to the selected SDRAMs.

At step 1308 and from time t4 to time t6, a read command is sent on column lines 1236. The read command includes device, bank, and column address information for the desired read location in the selected SDRAMs. At step 1310 and from time t6 to time t7, request handling logic 1004 deserializes the read command and provides this information to control logic 1002. Control logic 1002 then provides the column address and the read command to the selected SDRAMs over address bus 1214 and/or 1222 and over control bus 1238 and/or 1240, respectively. For one embodiment, the appropriate read command includes disabling RAS lines 1212 and/or 1220 and WE lines 1210 and/or 1218, and enabling CS lines 1213 and/or 1221 and CAS lines 1211 and/or 1219 at the rising edge of CLK 1208 and/or CLK 1216.

If there is a difference between the number of bytes selected in the selected SDRAMs and the number of bytes expected from a single read transaction by the system memory controller, then steps 1308 and 1310 may be repeated a desired number of times to match the number of bytes. For example, as shown in FIG. 14, if the first read command READ1 on column 1236 (together with the activate command on row 1234) addresses 16 bytes of data and the read command to the selected SDRAMs addresses 32 bytes of data, then a second read command READ2 may be issued from time t6 to time t9 to address the second 16 bytes.

At step 1312 and from time t8 to time t15, data I/O circuitry 1022 may receive data read from the selected SDRAMs. For example, 32 bytes of data may be read from the four SDRAMs 1204-1207 in the following manner: from time t8 to time t10 data I/O circuitry 1022 may receive data packet D0 that includes the first eight bytes, two bytes from each of the four SDRAMs 1204-1207; from time t10 to time t12 data packet D1 that includes the second eight bytes, two bytes from each of the four SDRAMs; from time t12 to time t13 data packet D2 that includes the third eight bytes, two bytes from each of the four SDRAMs; and, from time t13 to time t14 data packet D3 that includes the last eight bytes, two bytes from each of the four SDRAMs. It will be appreciated that for other embodiments a different number of bytes and a different number of cycles may be required to read the selected data from the selected SDRAMs.

When the read data is received, it may be stored in read buffer 1038 prior to providing the data to data handling logic 1046. Alternatively, it may be provided directly to data handling logic 1046. At step 1314, data handling logic may serialize or pack the data into the proper format expected by the system memory controller on data bus 1232. For one embodiment, data packets D0 and D1, including a total of 16 bytes of data from SDRAMs 1204-1207, may be packed into one uninterrupted transmission DATA1 that may provided to data bus 1232 at step 1316 and from time t11 to time t15. Similarly, data packets D2 and D3, including a second 16 bytes of data from SDRAMs 1204-1207 may be packed into one uninterrupted transmission DATA2 that may provided to data bus 1232 at step 1316 and from time t14 to time t16.

Figure 15:
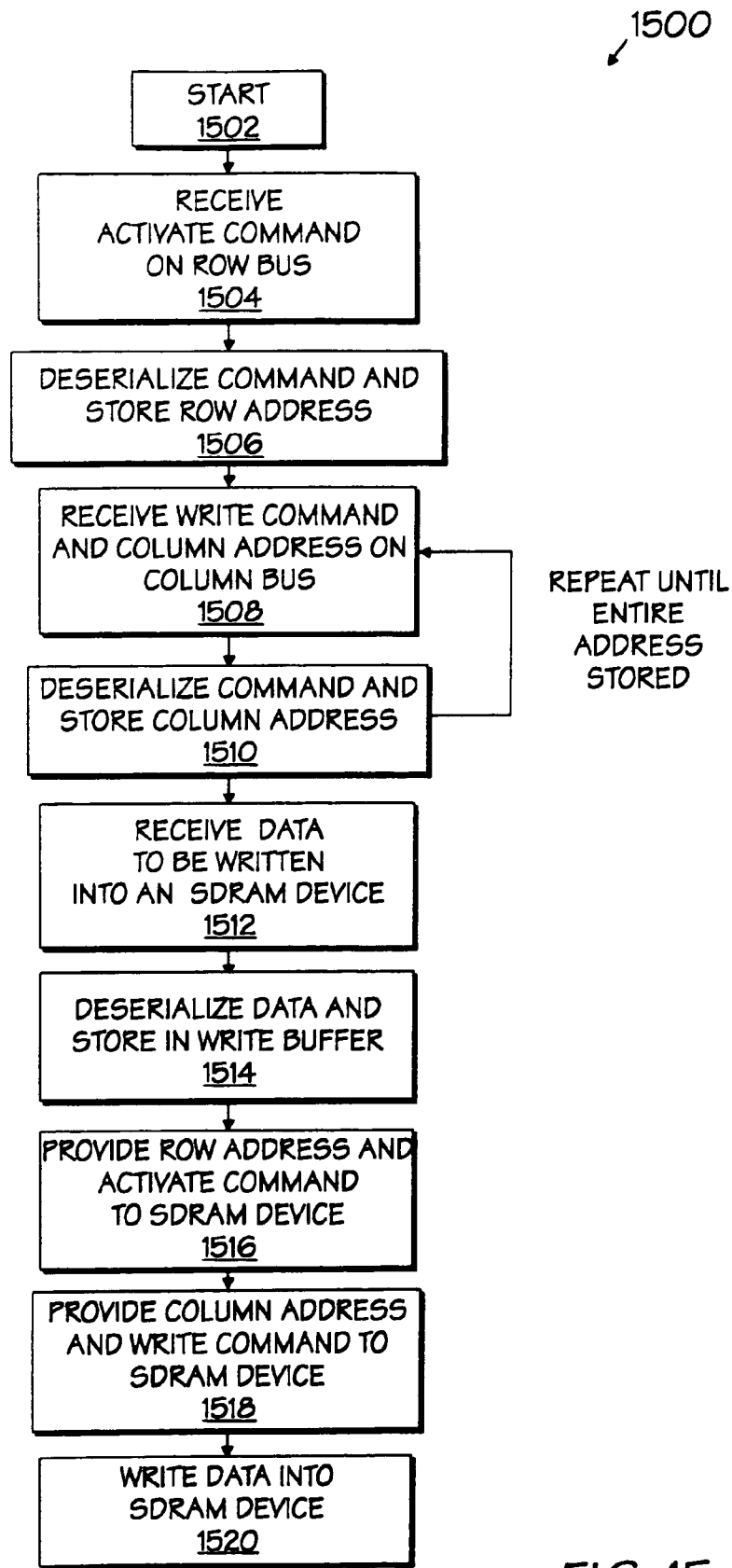
FIG. 15 is a flow chart of one embodiment of a write transaction implemented by the memory module controller of FIG. 12.

FIG. 15 shows one embodiment of a process implemented by memory module controller 1202 to perform a write transaction to one or more of SDRAMs 1204-1207 after receiving a write request from system memory bus 1242. The same process may be used to write data to any of the SDRAMs. FIG. 15 is described with the aid of the exemplary timing diagram of FIG. 16. Memory module controller 1202 may implement the process of FIG. 13 using the circuitry shown in memory module 1000 of FIG. 10.

It will be appreciated that FIG. 15 shows CLK 1228 having approximately twice the frequency of CLK 1208. For one embodiment, CLK 1228 may have a frequency of approximately 400 MHz and CLK 1208 may have a frequency of approximately 200 MHz. For other embodiments, different ratios of frequencies, and/or different frequencies, may be used.

The process starts at step 1502. At step 1504 and from time t0 to time t1, an activate command is sent on row lines 1234 including a device, bank, and row address of memory locations in one or more of selected SDRAMs 1204-1207. At step 1506, data request logic 1004 deserializes the command and address information and provides this information to control logic 1002.

Because the memory addressing scheme protocol used by Direct RDRAM™ devices may be different than that used by SDRAMs 1204-1207, the activate command supplied on row address lines 1234 may include column address information for the selected SDRAMs. In this example, this column address information may be stored in address storage unit 1040 until such time that the column address information is issued to the selected SDRAMs.

Figure 16:
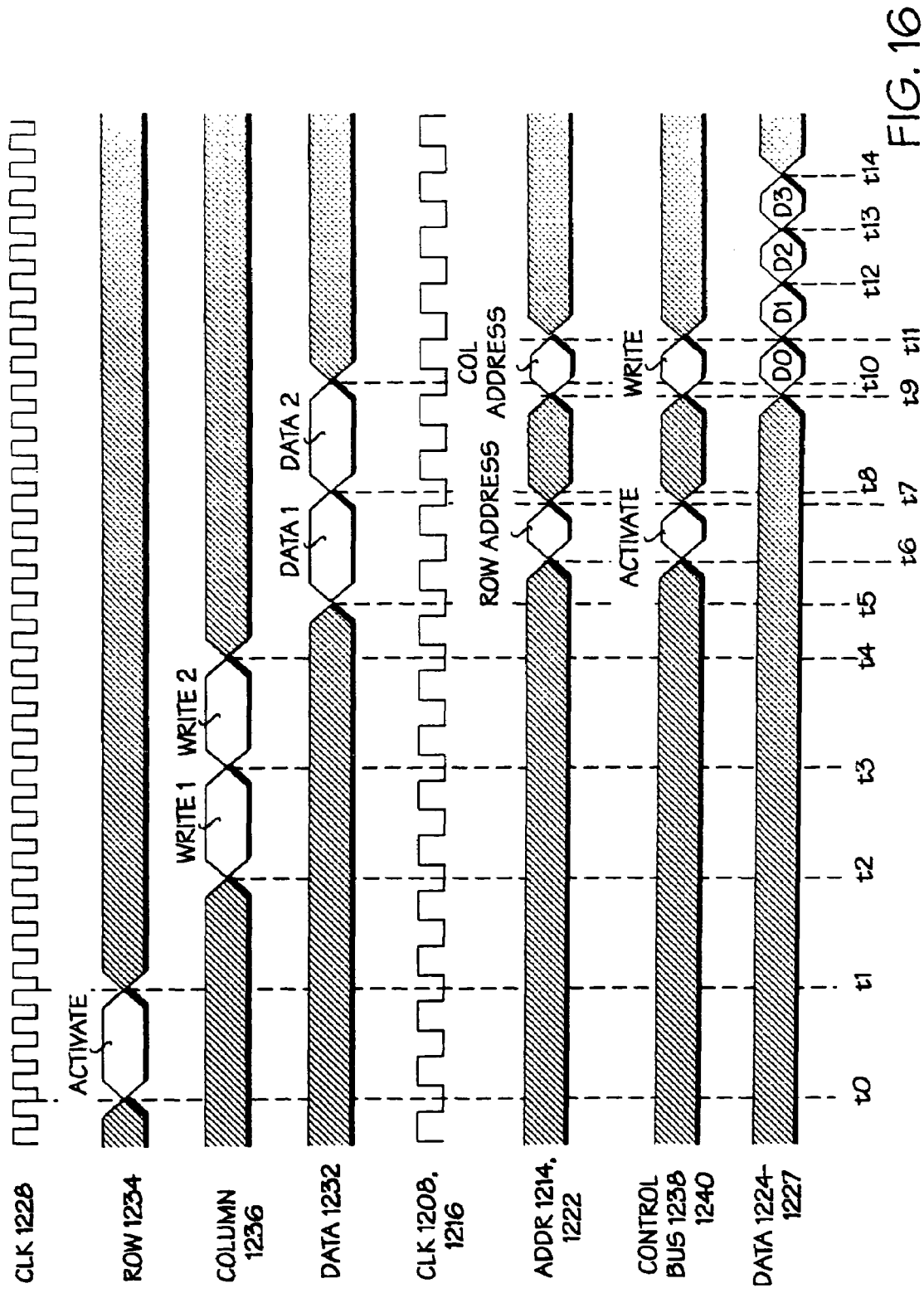
FIG. 16 is an exemplary timing diagram of the write transaction implemented by the memory module controller of FIG. 12.

At step 1508 and from time t2 to time t3, a write command is sent on column lines 1236. The write command includes device, bank, and column address information for the desired write locations in the selected SDRAMs. At step 1510, request handling logic 1004 deserializes the write command and provides this information to control logic 1002. If there is a difference between the number of bytes selected for writing in the selected SDRAMs and the number of bytes selected by the system memory controller, then steps 1508 and 1510 may be repeated a desired number of times to match the number of bytes. For example, as shown in FIG. 16, if the first write command WRITE1 on column 1236 (together with the activate command on row 1234) selects 16 bytes of data and the write command to the selected SDRAMs addresses 32 bytes of data, then a second write command WRITE2 may be issued from time t3 to time t4 to address the second 16 bytes.

At step 1512 and from time t5 to time t6, data handling logic 1046 may receive write data DATA1 from data bus 1232 and may unpack or deserialize the write data. Data handling logic 1046 may store the write data DATA1 into write buffer 1012, and address storage 1014 may store the write address output by request handling logic 1004. If a subsequent write or read command is received, control logic 1002 may inspect write buffer 1012 and address storage 1014 for the requested address. If the address is located in address storage 1014, then the corresponding data in write buffer 1012 may be read or overwritten. If a subsequent write command WRITE2 is issued, then DATA2 received from time t8 to time t10, and associated with this command, may be unpacked or deserialized and also stored in write buffer 1012.

At step 1516 and from time t6 to time t7, control logic 1002 then provides the row address to the selected SDRAMs over address bus 1214 and/or 1222, and the appropriate bank activate command to the selected SDRAMs over control bus 1238 and/or 1240. For one embodiment, the appropriate bank activate command includes disabling CAS lines 1211 and/or 1219 and WE lines 1210 and/or 1218, and enabling CS lines 1213 and/or 1221 and RAS lines 1212 and/or 1220 at the rising edge of CLK 1208 and/or CLK 1216. At step 1518 and from time t9 to time t11, control logic 1002 then provides the column address and the write command to the selected SDRAMs over address bus 1214 and/or 1999 and control bus 1238 and/or 1240, respectively. For one embodiment, the appropriate write command includes disabling RAS lines 1212 and/or 1210 and enabling CS lines 1213 and/or 1221, RAS lines 1212 and/or 1210, and WE lines 1210 and/or 1218 at the rising edge of CLK 1208 and/or CLK 1216.

At step 1520 and from time t9 to time t14, control logic may cause the write data to be provided to the selected SDRAMs on data lines 1224, 1225, 1226, and/or 1227 from data I/O circuitry 1022. For example, 32 bytes of data may be written to the four SDRAMs 1204-1207 in the following manner: from time t9 to time t11 data I/O circuitry 1022 may provide data packet D0 including the first eight bytes, two bytes to each of the four SDRAMs; and from time t11 to time t12 data packet D1 including the second eight bytes, two bytes to each of SDRAMs 1204-1207. D0 and D1 may correspond to DATA1. Additionally, from time t12 to time t13 data I/O circuitry 1022 may provide data packet D2 including the third eight bytes, two bytes to each of SDRAMs 1204-1207, and from time t13 to time t14 data packet D3 including the last eight bytes, two bytes to each of SDRAMs 1204-1207. D2 and D3 may correspond to DATA2. It will be appreciated that for other embodiments a different number of bytes and a different number of cycles may be required to write the selected the data to the selected SDRAMs. Although in this example all DRAMs are written to, in alternative embodiments a partial write to one (or less than all) of the SDRAMs may be executed.

In an alternative embodiment, memory module controller 102 may also provide a bridge between system memory bus 1242 and SDRAMs 1204-1207 using a modified protocol. The modified protocol may be demultiplexed having a data bus and a separate control bus that transmits control information and address between a system memory controller (e.g., system memory controller 304 of FIG. 3) and memory module controller 1202.

Figure 17:
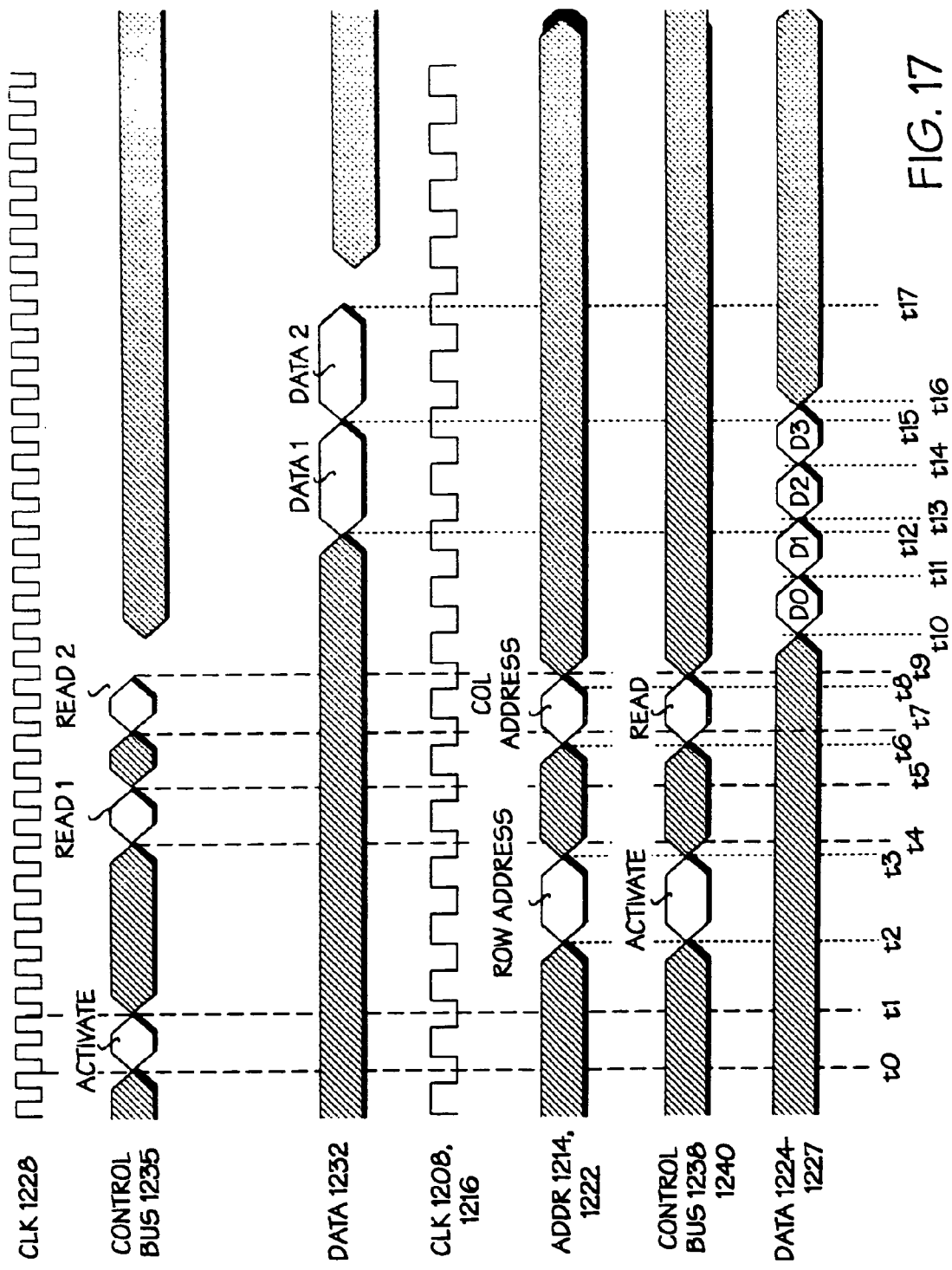
FIG. 17 is an exemplary timing diagram of a read transaction implemented by the memory module controller of FIG. 12 using a modified protocol.

In this embodiment, a read transaction from one or more of SDRAMs 1204-1207 may be performed as shown in FIG. 17 wherein row bus 1234 and column bus 1236 are used as one control bus 1235 having eight signal lines. For other embodiments, a different number of signal lines may be used.

From time t0 to time t1, an activate command is sent on control bus 1235 including a device, bank, and row address of selected memory locations in SDRAMs 1204-1207. In this embodiment, the activate command may be spread over two cycles (i.e., cycle 0 and cycle 1 in Table 1 below) of CLK 1228 in which data is transferred on each lock edge of the CLK 1228 (i.e., double-pumped). For one embodiment the packet format is as shown in Table 1 where RQ[7:0] correspond to the signal lines of control bus 1235.

TABLE 1

| Cycle | RQ[7] | RQ[6] | RQ[5] | RQ[4] | RQ[3] | RQ[2] | RQ[1] | RQ[0] |
|---|---|---|---|---|---|---|---|---|
| 0 | ST | SF | D[4] | D[3] | D[2] | D[1] | D[0] | B[0] |
| 0 | R[6] | R[5] | R[4] | R[3] | R[2] | R[1] | R[0] | B[1] |
| 1 | R[13] | R[12] | R[11] | R[10] | R[9] | R[8] | R[7] | B[2] |

The activate command includes several fields:

B[2:0] Bank Select: Selects one of eight banks in SDRAMs 1204-1207;

D[4:0] Device Select: Selects one of $2^5$ or 32 memory module controllers;

R[13:0] Row Address: Provides a row address for one or more locations selected in SDRAMs 1204-1207; and ST, SF Encoded Frame/Fast Command: Bits used to indicate whether a command is framed as indicated in Table 2. The Extended commands may include noop, precharge, refresh, and other commands.

TABLE 2

| ST | SF | Operation |
|---|---|---|
| 0 | 0 | No Framing |
| 0 | 1 | Frame an Active Command (page activate) |
| 1 | 0 | Frame a Read/Write Command (page hit) |
| 1 | 1 | Frame an Extended Command |

From time t2 to time t3, data request logic 1004 deserializes the command and address information and provides this information to control logic 1002. Control logic 1002 then provides the row address to the selected SDRAMs over address bus 1214 and/or 1222, and the appropriate bank activate command to the selected SDRAMs over control bus 1238 and/or 1240 (e.g., as described above with respect to FIGS. 13 and 14).

From time t4 to time t5, a read command is sent on control bus 1235. The read command includes device, bank, and column address information for the desired read locations in the SDRAMs. In this embodiment, the read command may be spread over two cycles (i.e., cycle 0 and cycle 1 in Table 3 below) of CLK 1228, and have a packet format as shown in Table 3.

TABLE 3

| Cycle | RQ[7] | RQ[6] | RQ[5] | RQ[4] | RQ[3] | RQ[2] | RQ[1] | RQ[0] |
|---|---|---|---|---|---|---|---|---|
| 0 | ST | SF | D[4] | D[3] | D[2] | D[1] | D[0] | B[0] |
| 0 | C[6] | C[5] | C[4] | C[3] | C[2] | C[1] | C[0] | C[1] |
| 1 | AP | R/W | C[11] | C[10] | C[9] | C[8] | C[7] | C[2] |

The read command includes several different fields not present in the activate command:

C[11:0] Row Address: Provides a column address for one or more locations selected in SDRAMs 1204-1207;

R/W Read Write: indicates whether the command is a read transaction or a write transaction. When this signal is in one logical state it indicates a read transaction, and when it is in the complementary logic state it indicates a write transaction; and AP Autoprecharge: Indicates whether the selected column (or row) of selected memory cells should be precharged after reading.

From time t6 to time t8, request handling logic 1004 deserializes the read command and provides this information to control logic 1002. Control logic 1002 then provides the column address and the read command to the selected SDRAMs over address bus 1214 and/or 1222 and over control bus 1238 and/or 1240, respectively, (e.g., as described above with respect to FIGS. 13 and 14). If the first read command READ1 on control bus 1235 addresses less bytes of data and the read command issued to SDRAMs 1204-1207, then a second read command READ2 may be issued from time t7 to time t9.

From time t10 to time t16, data I/O circuitry 1022 may receive data read from the selected SDRAMs. For example, 32 bytes of data may be read from the four SDRAMs 1204-1207 in the following manner: from time t10 to time t11 data I/O circuitry 1022 may receive data packet D0 that includes the first eight bytes, two bytes from each of the four SDRAMs 1204-1207; from time t11 to time t12 data packet D1 that includes the second eight bytes two bytes from each of the four SDRAMs; from time t13 to time t14 data packet D2 that includes the third eight bytes, two bytes from each of the four SDRAMs; and, from time t14 to time t16 data packet D3 that includes the last eight bytes, two bytes from each of the four SDRAMs. It will be appreciated that for other embodiments a different number of bytes and a different number of cycles may be required to read the selected data from the selected SDRAMs.

When the read data is received, it may be stored in read buffer 1038 prior to providing the data to data handling logic 1046. Alternatively, it may be provided directly to data handling logic 1046. At step 1314, data handling logic may serialize or pack the data into the proper format expected by the system memory controller on data bus 1232. For one embodiment, data packets D0 and D1, including a total of 16 bytes of data from SDRAMs 1204-1207, may be packed into one uninterrupted transmission DATA1 that may provided to data bus 1232 from time t12 to time t15. Similarly, data packets D2 and D3, including a second 16 bytes of data from SDRAMs 1204-1207 may be packed into one uninterrupted transmission DATA2 that may provided to data bus 1232 from time t15 to time t17.

Figure 18:
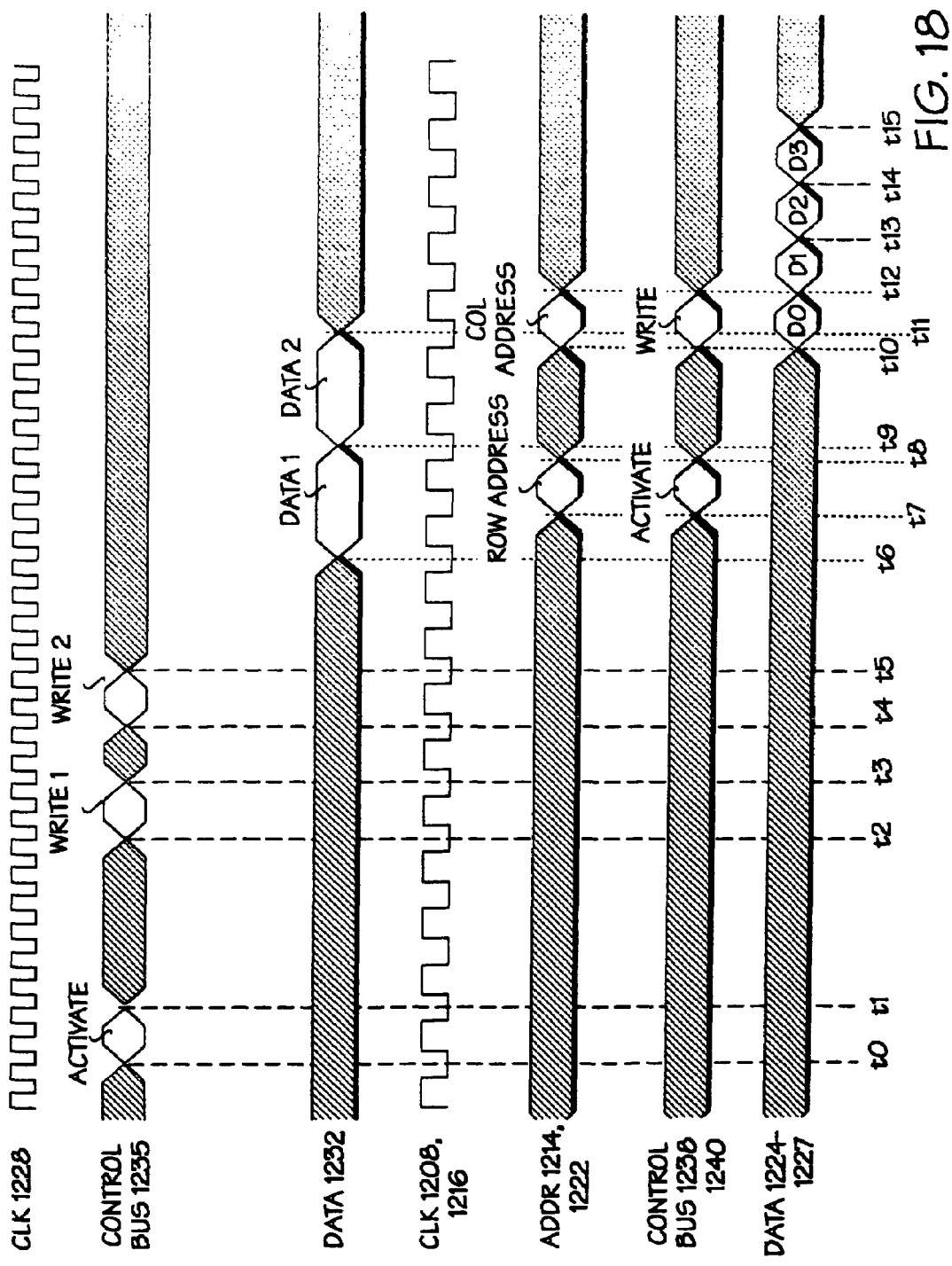
FIG. 18 is an exemplary timing diagram of a write transaction implemented by the memory module controller of FIG. 12 using a modified protocol.

For this embodiment, a write transaction to one or more of SDRAMs 1204-1270 may be performed as shown in FIG. 18. From time t0 to time t1, an activate command as shown in Table 1 is sent on control bus 1235 including a device, bank, and row address of memory locations in one or more of SDRAMs 1204-1207. Data request logic 1004 deserializes the command and address information and provides this information to control logic 1002.

From time t2 to time t3, a write command is sent on control bus 1235 that includes device, bank, and column address information for the desired write locations in SDRAMs 1204-1207. The write command uses the packet format shown in Table 3 with the R/W bit set appropriately to indicate a write transaction. Request handling logic 1004 deserializes the write command and provides this information to control logic 1002. If there is a difference between the number of bytes selected for writing in SDRAMs 1204-1207 (e.g., 32 bytes) and the number of bytes selected by the single write transaction issued by the system memory controller (e.g., 16 bytes), then the first write command WRITE1 on control bus 1235 may write a first amount (e.g., 16 bytes) of data, and a second write command WRITE2 may be issued from time t4 to time t5 to write a second amount of data (e.g., another 16 bytes).

From time t6 to time t9, data handling logic 1046 may receive write data DATA1 from data bus 1232 and may unpack or deserialize the write data. Data handling logic 1046 may store the write data DATA1 into write buffer 1012, and address storage 1014 may store the write address output by request handling logic 1004. If a subsequent write or read command is received, control logic 1002 may inspect write buffer 1012 and address storage 1014 for the requested address. If the address is located in address storage 1014, then the corresponding data in write buffer 1012 may be read or overwritten. If a subsequent write command WRITE2 is issued, then DATA2 received from time t9 to time t11, and associated with this command, may be unpacked or deserialized and also stored in write buffer 1012.

From time t7 to time t8, control logic 1002 then provides the row address to the selected SDRAMs over address bus 1214 and/or 1222, and the appropriate bank activate command to SDRAMs 1204-1207 over control bus 1238 and/or 1240 (e.g., as described above with respect to FIGS. 15 and 16). From time t11 to time t12, control logic 1002 then provides the column address and the write command to the selected SDRAMs over address bus 1214 and/or 1222 and over control bus 1238 and/or 1240, respectively (e.g., as described above with respect to FIGS. 15 and 16).

From time t10 to time t15, control logic may cause the write data to be provided to the selected SDRAMs on data lines 1224, 1225, 1226, and/or 1227 from data I/O circuitry 1022. For example, 32 bytes of data may be written to the four SDRAMs 1204-1207 in the following manner: from time t10 to time t12 data I/O circuitry 1022 may provide data packet D0 including the first eight bytes, two bytes to each of the four SDRAMs; and from time t12 to time t13 data packet D1 including the second eight bytes, two bytes to each of SDRAMs 1204-1207. D0 and D1 may correspond to DATA1. Additionally, from time t13 to time t14 data I/O circuitry 1022 may provide data packets D2 including the third eight bytes, two bytes to each of SDRAMs 1204-1207, and from time t14 to time t15 data packet D3 including the last eight bytes, two bytes to each SDRAMs 1204-1207. D2 and D3 may correspond to DATA2. It will be appreciated that for other embodiments a different number of bytes and a different number of cycles may be required to write the selected the data to the selected SDRAMs. Although in this example all DRAMs are written to, in alternative embodiments a partial write to one (or less than all) of the SDRAMs may be executed.

Although the present invention has been described in terms of specific embodiments, it will be appreciated that various modifications and alterations might be made by those skilled in the art without departing from the spirit and scope of the invention. The invention should therefore be measured in terms of the claims that follow.

What is claimed is:

1. A memory module comprising:
a first plurality of memory devices; and
a first memory module controller to be coupled to a system memory bus, the first memory module controller to generate a signal to at least one of the plurality of memory devices that is independent of signal loading or operating voltage of the system memory bus.

2. The memory module of claim 1, wherein the first memory module controller further comprises a clock generator to generate a clock signal to drive the signal, wherein the clock signal is a different frequency than a clock signal of the system memory bus.

3. The memory module of claim 2, wherein the first memory module controller further comprises a request handling logic to examine a memory request to determine whether the memory request is addressed to at least one of the first plurality of memory devices and to ignore the memory request if the memory request is not addressed to any of the first plurality of memory devices.

4. The memory module of claim 3, wherein the first memory module controller further comprises a power management unit to control power supplied to the first plurality of memory devices.

5. The memory module of claim 4, wherein the first plurality of memory devices and the system memory bus operate at different power voltages.

6. The memory module of claim 5, wherein the power management unit is to reduce at least a portion of the power to the first plurality of memory devices, if the memory request is not addressed to any of the first plurality of memory devices.

7. The memory module of claim 6, wherein the first memory module controller further comprises a control logic coupled to the request handling logic, the clock generator, and the power management unit, the control logic configured to decouple the first plurality of memory devices from the system memory bus if the memory request is not addressed to any of the first plurality of memory devices.

8. The memory module of claim 7, wherein in response to a signal from the request handling logic indicating that the memory request is not addressed to any of the first plurality of memory devices, the control logic is to instruct the clock generator to alter a frequency of the clock signal to the first plurality of memory devices.

9. The memory module of claim 8, wherein the control logic is to further instruct the power management unit to disable the clock generator if the memory request is not addressed to any of the first plurality of memory devices, which in turn reduces the power dissipation of the first plurality of memory devices.

10. The memory module of claim 9, further comprising a second memory module coupled to the system memory bus, the second memory module including:
a second plurality of memory devices; and
a second memory module controller coupled to the second plurality of memory devices and the system memory bus, the second memory module controller to manage the second plurality of memory devices independent of the first memory module controller of the first memory module and the second memory module controller is to separate the second plurality of memory devices of the second memory module from a system memory controller coupled to the system memory bus.

11. The memory module of claim 10, wherein the first plurality of memory devices and the second plurality of memory devices have different signaling protocols, which are controlled by the first and second memory module controllers respectively, and wherein the different signaling protocols of the first and second pluralities of memory devices are incompatible with signaling protocols of the system memory controller and the system memory bus.

12. An apparatus comprising:
a first memory module including a first plurality of memory devices and a first memory module controller to be coupled to a system memory bus, the first memory module controller to decouple the first plurality of memory devices from the system memory bus and including a clock generator to generate a clock signal for the first plurality of memory devices at a different frequency than a clock signal of the system memory bus.

13. The apparatus of claim 12, wherein the first memory module controller is to bridge a first protocol in which the system memory bus operates and a second protocol in which the first plurality of memory devices operates.

14. The apparatus of claim 12, wherein the first memory module further comprises signal lines coupled between the first plurality of memory devices and the first memory module controller, wherein the signal lines have a reduced loading as compared to the system memory bus.

15. The apparatus of claim 14, wherein the first memory module is to operate at a lower voltage than a system in which the first memory module is located.

16. The apparatus of claim 12, further comprising a second memory module including a second plurality of memory devices and a second memory module controller to be coupled to the system memory bus, the second memory module controller to decouple the second plurality of memory devices from the system memory bus.

17. The apparatus of claim 16, wherein the first plurality of memory devices and the second plurality of memory devices have different signaling protocols and wherein the different signaling protocols of the first and second pluralities of memory devices are different than signaling protocols of the system memory bus.

* * * * *